(12) United States Patent
Yun et al.

(10) Patent No.: US 11,549,013 B2
(45) Date of Patent: *Jan. 10, 2023

(54) POLYIMIDE COPOLYMER AND POLYIMIDE FILM USING SAME

(71) Applicant: LG CHEM, LTD., Seoul (KR)

(72) Inventors: Cheolmin Yun, Daejeon (KR); Kyungjun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 594 days.

This patent is subject to a terminal disclaimer.

(21) Appl. No.: 16/482,885

(22) PCT Filed: Jul. 17, 2018

(86) PCT No.: PCT/KR2018/008045
§ 371 (c)(1),
(2) Date: Aug. 1, 2019

(87) PCT Pub. No.: WO2019/054616
PCT Pub. Date: Mar. 21, 2019

(65) Prior Publication Data
US 2021/0292555 A1 Sep. 23, 2021

(30) Foreign Application Priority Data

Sep. 14, 2017 (KR) .................. 10-2017-0118000

(51) Int. Cl.
| | | |
|---|---|---|
| *C08L 79/08* | (2006.01) |
| *C08G 73/10* | (2006.01) |
| *C08G 77/26* | (2006.01) |
| *C08G 77/00* | (2006.01) |
| *C08K 5/20* | (2006.01) |
| *C08K 5/3415* | (2006.01) |

(52) U.S. Cl.
CPC ............ *C08L 79/08* (2013.01); *C08G 73/106* (2013.01); *C08G 73/1032* (2013.01); *C08G 73/1039* (2013.01); *C08G 73/1067* (2013.01); *C08G 77/26* (2013.01); *C08G 77/80* (2013.01); *C08K 5/20* (2013.01); *C08K 5/3415* (2013.01); *C08L 2201/08* (2013.01); *C08L 2201/10* (2013.01); *C08L 2203/16* (2013.01); *C08L 2203/20* (2013.01)

(58) Field of Classification Search
CPC ........................................... C08G 73/10–1082
See application file for complete search history.

(56) References Cited

U.S. PATENT DOCUMENTS

| | | |
|---|---|---|
| 8,092,900 B2 | 1/2012 | Shimoosako et al. |
| 8,193,295 B2 | 6/2012 | Sunaga et al. |
| 9,012,537 B2 | 4/2015 | Takasaki et al. |
| 10,544,266 B2 | 1/2020 | Yun et al. |
| 2009/0088551 A1 | 4/2009 | Yamashita et al. |
| 2017/0096530 A1 | 4/2017 | Yun et al. |

FOREIGN PATENT DOCUMENTS

| | | |
|---|---|---|
| CN | 106133025 A | 11/2016 |
| JP | 2017-524040 A | 8/2017 |
| KR | 10-2010-0057810 A | 6/2010 |
| KR | 10-2012-0061885 A | 6/2012 |
| KR | 10-2013-0080432 A | 7/2013 |
| KR | 10-2015-0141029 A | 12/2015 |
| KR | 10-2016-0097685 A | 8/2016 |
| KR | 10-2017-0057458 A | 5/2017 |
| KR | 10-1840978 B1 | 3/2018 |
| TW | 200617205 A | 6/2006 |
| TW | 201629123 A | 8/2016 |
| WO | 2016/140559 A1 | 9/2016 |

OTHER PUBLICATIONS

International Search Report issued for International Patent Application No. PCT/KR2018/008045 dated Oct. 24, 2018, 1 pages.
European Search Report issued for European Patent Application No. 18 855 643.5 dated Jan. 20, 2020, 7 pages.

*Primary Examiner* — Ana L. Woodward
(74) *Attorney, Agent, or Firm* — Rothwell, Figg, Ernst & Manbeck, P.C.

(57) ABSTRACT

A polyimide copolymer according to the present invention has a particular structure in which siloxane structures are distributed in a nanosize in a polymer and thus enables excellent transparency, heat resistance, mechanical strength and flexibility and effective reduction of residual stress, and thus can be used in various fields such as a substrate for a device, a cover substrate for a display, an optical film, an integrated circuit (IC) package, an adhesive film, a multilayer flexible printed circuit (FPC), tape, a touch panel and a protective film for an optical disk.

12 Claims, 12 Drawing Sheets

[Fig. 1a]
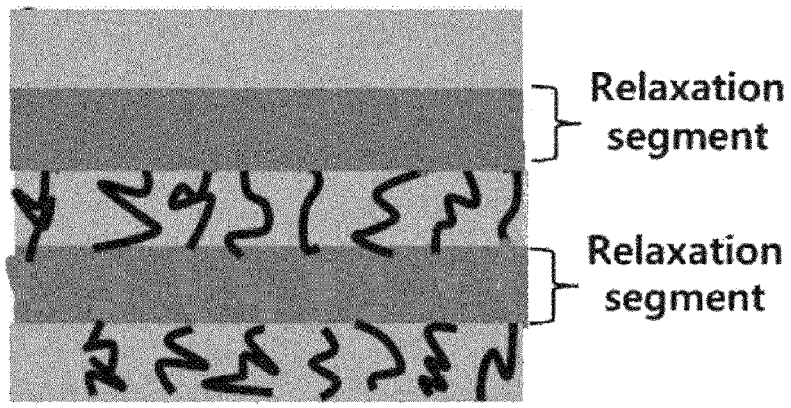
[Fig. 1b]
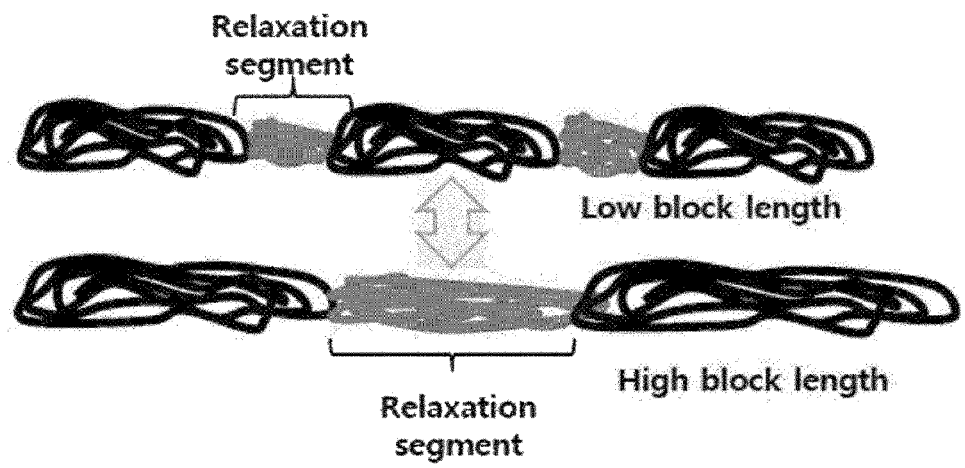

[Fig. 2a]
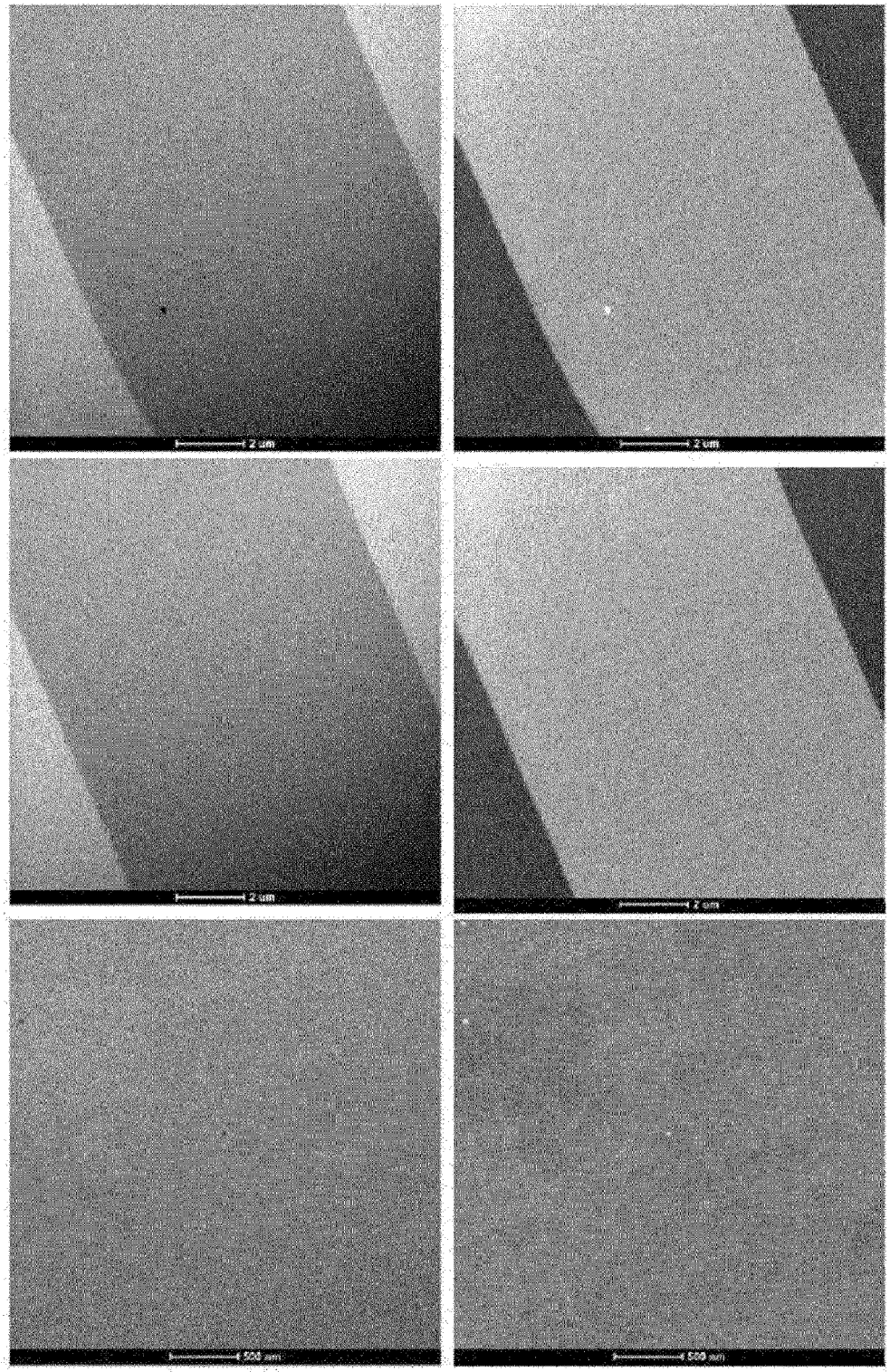

[Fig. 2b]
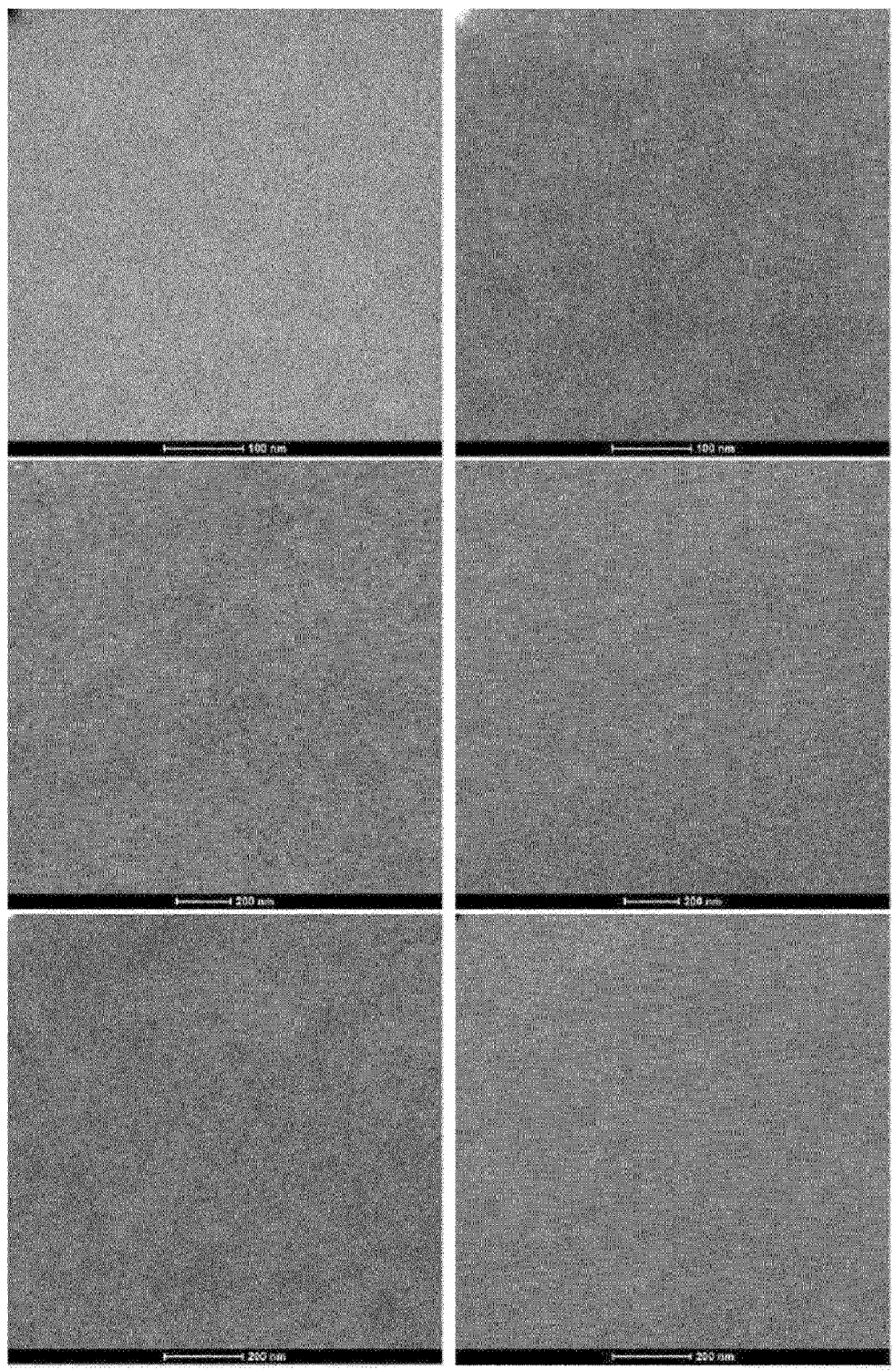

[Fig. 2c]
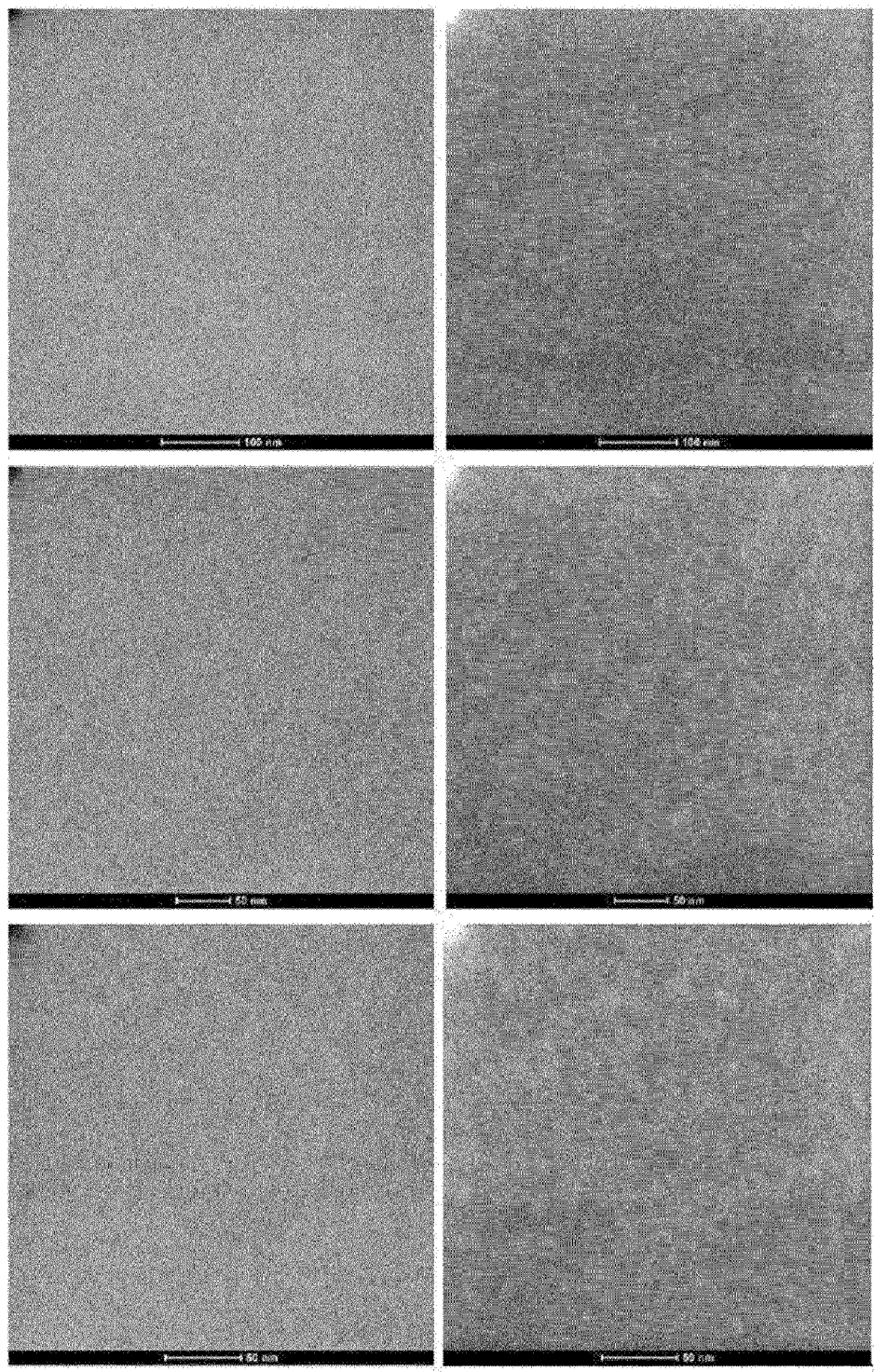

[Fig. 2d]
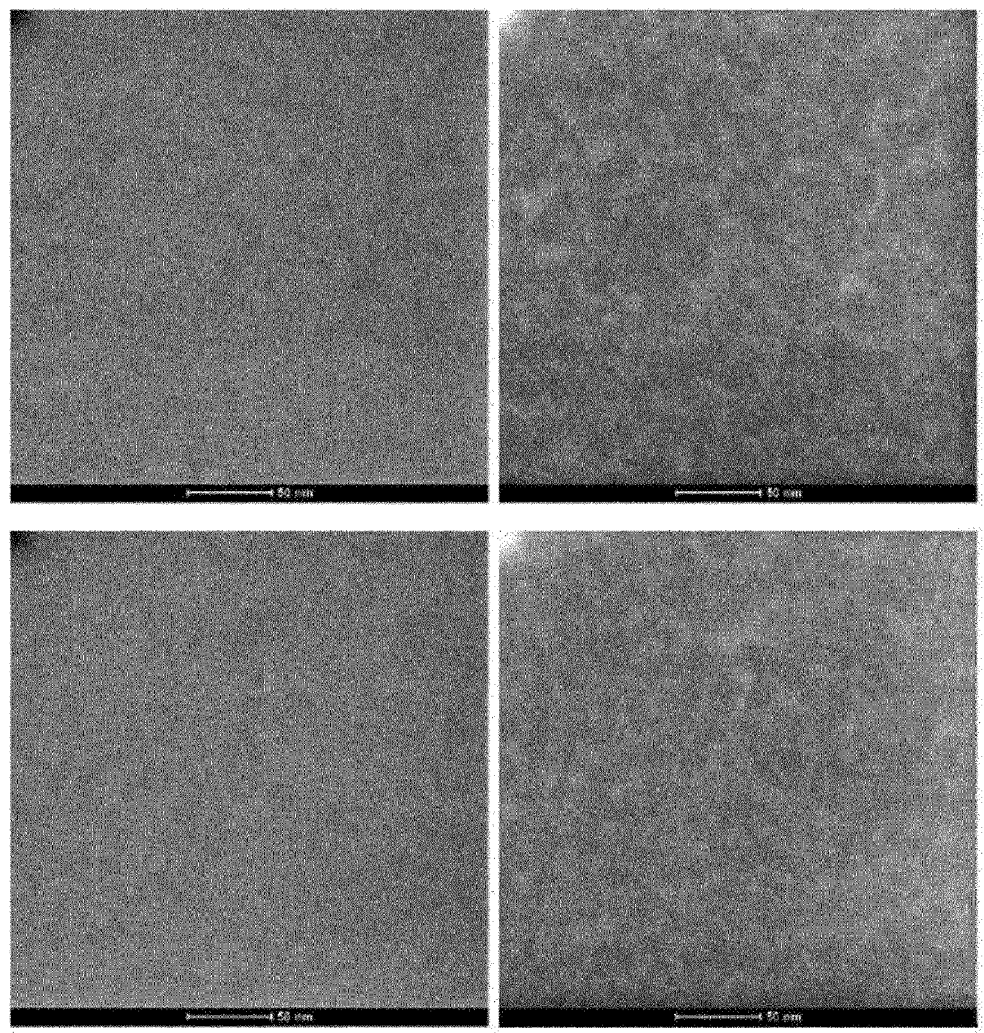

[Fig. 3a]    [Fig. 3b]
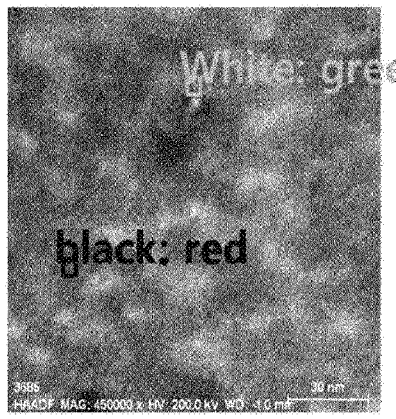
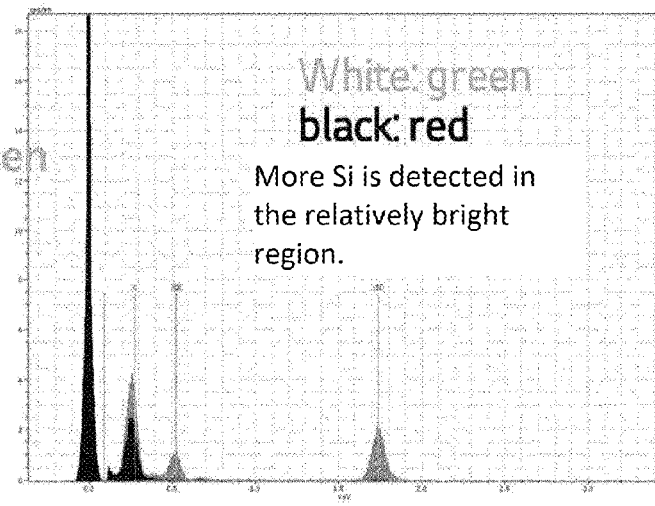

[Fig. 4a]
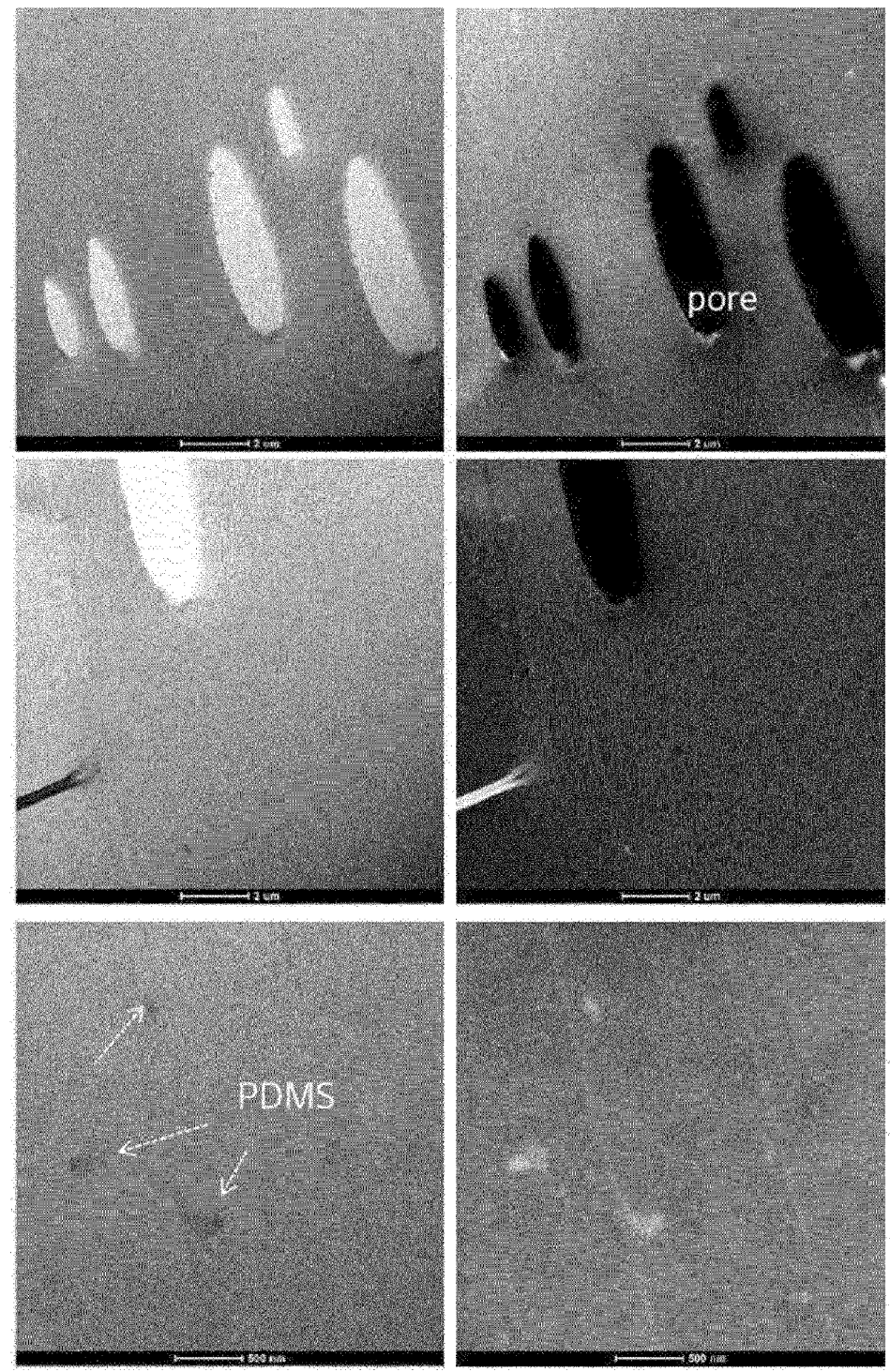

[Fig. 4b]
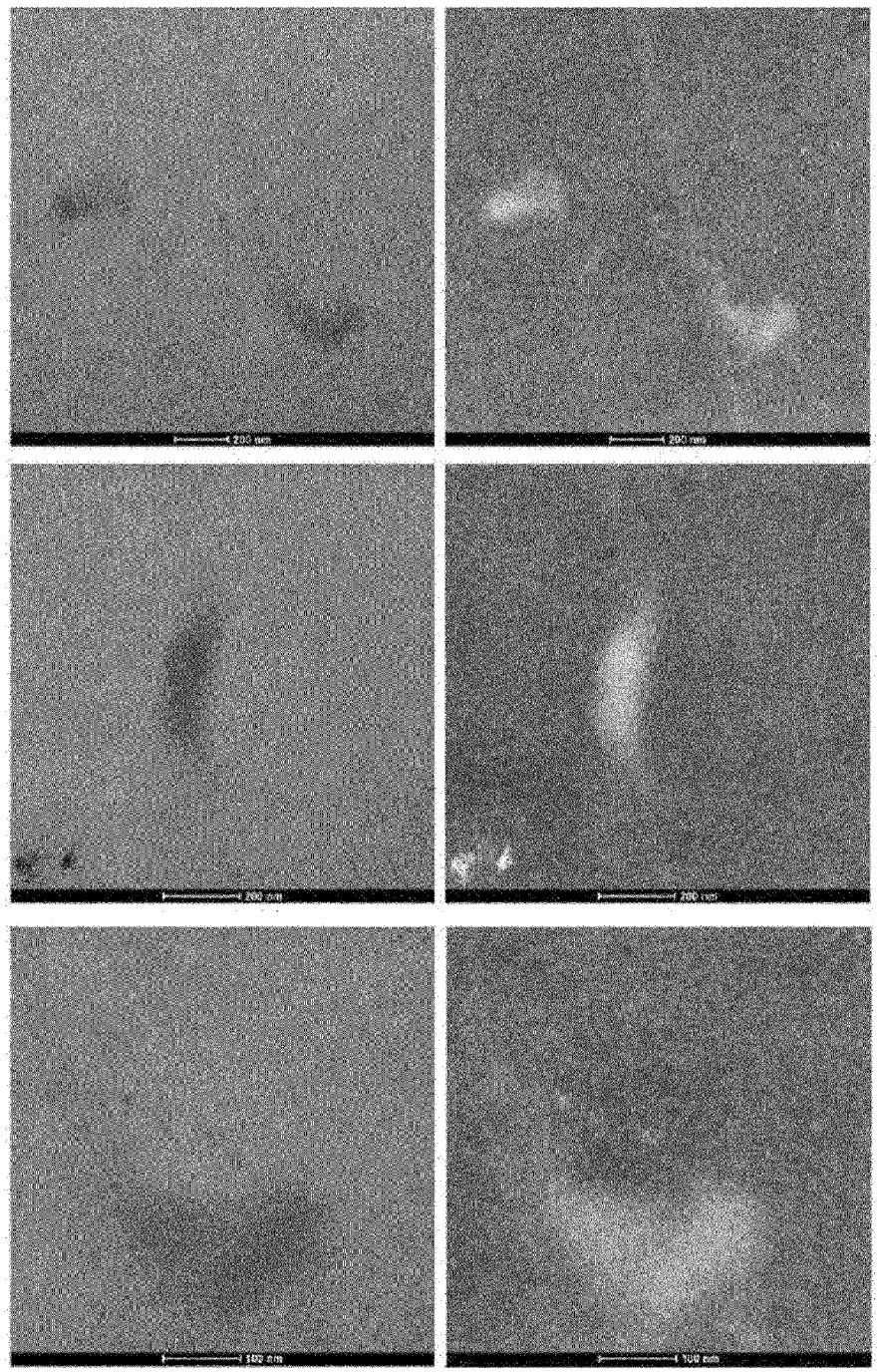

[Fig. 4c]
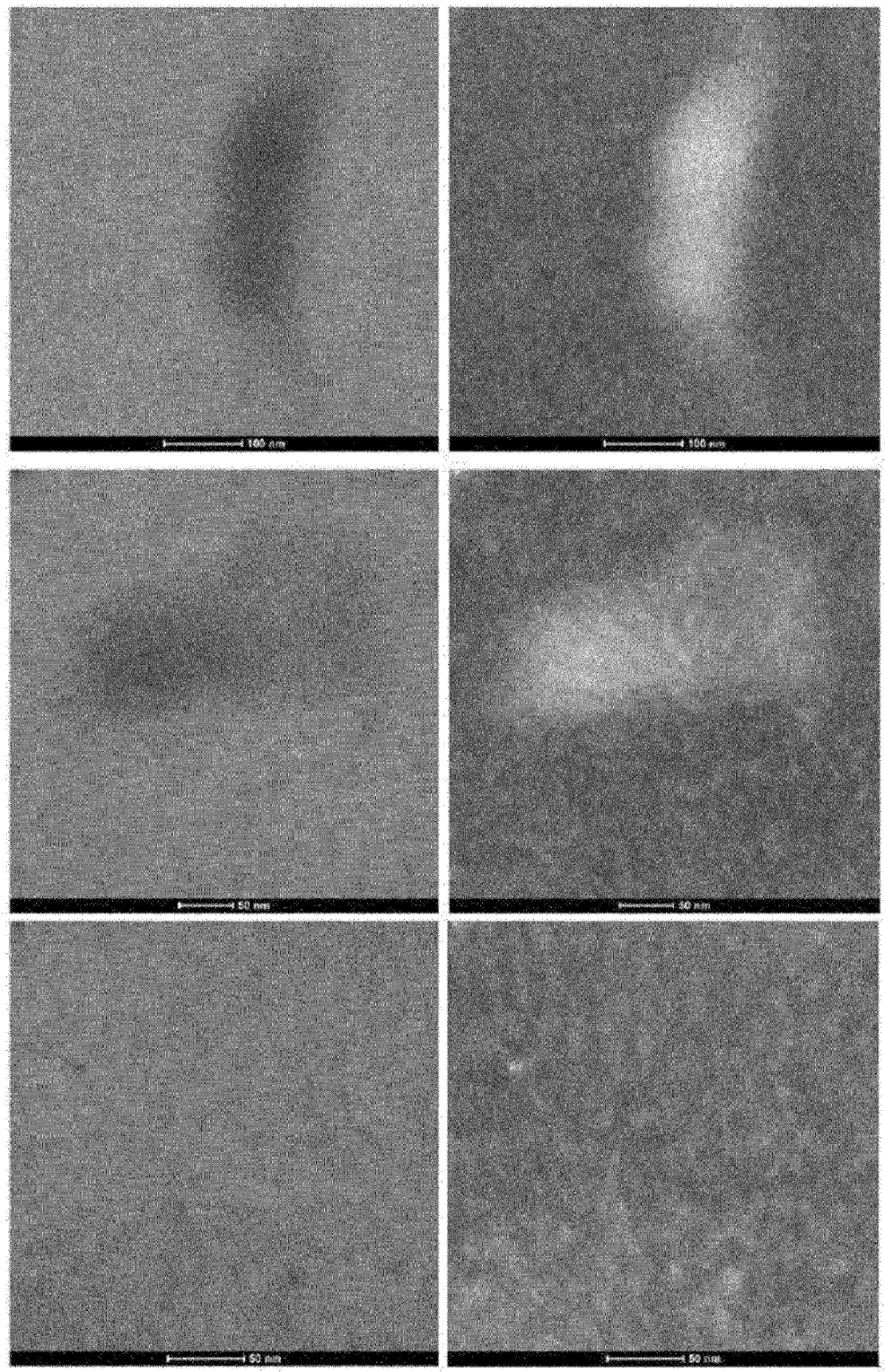

[Fig.4d]
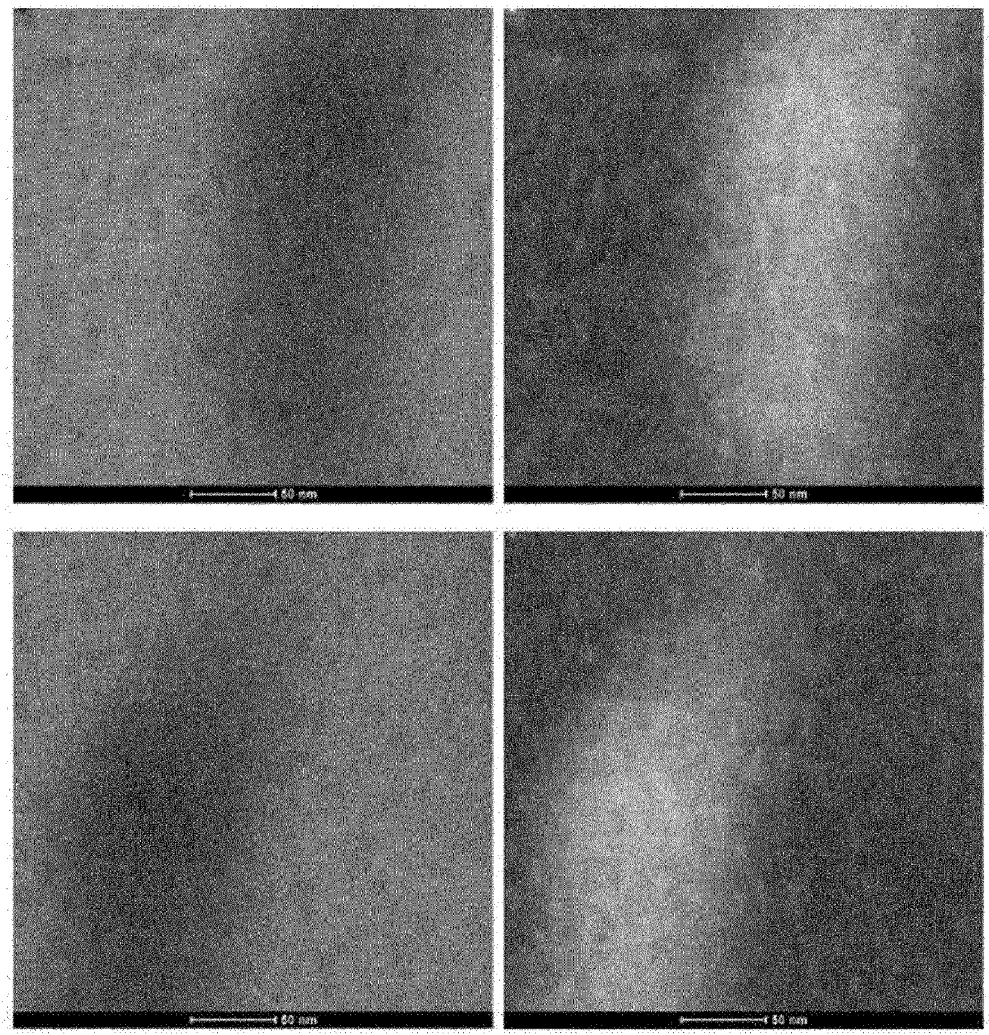

[Fig. 5a] [Fig. 5b]
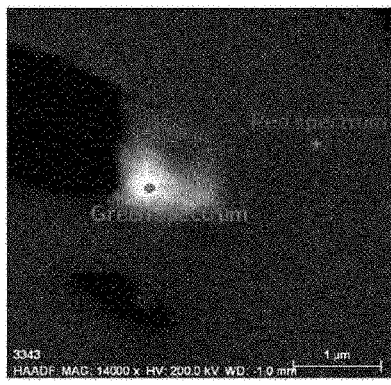 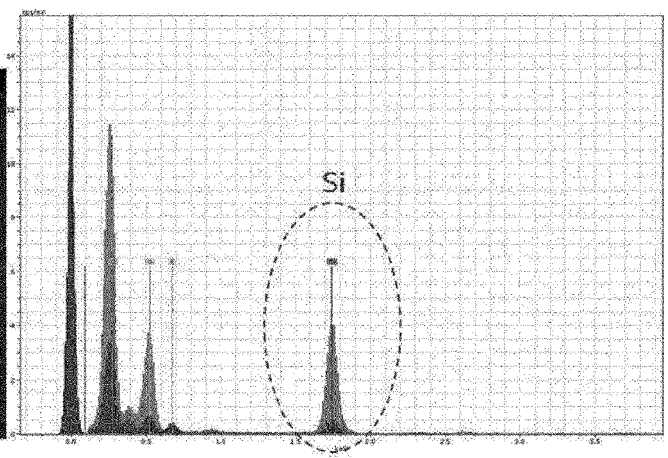
[Fig. 6]
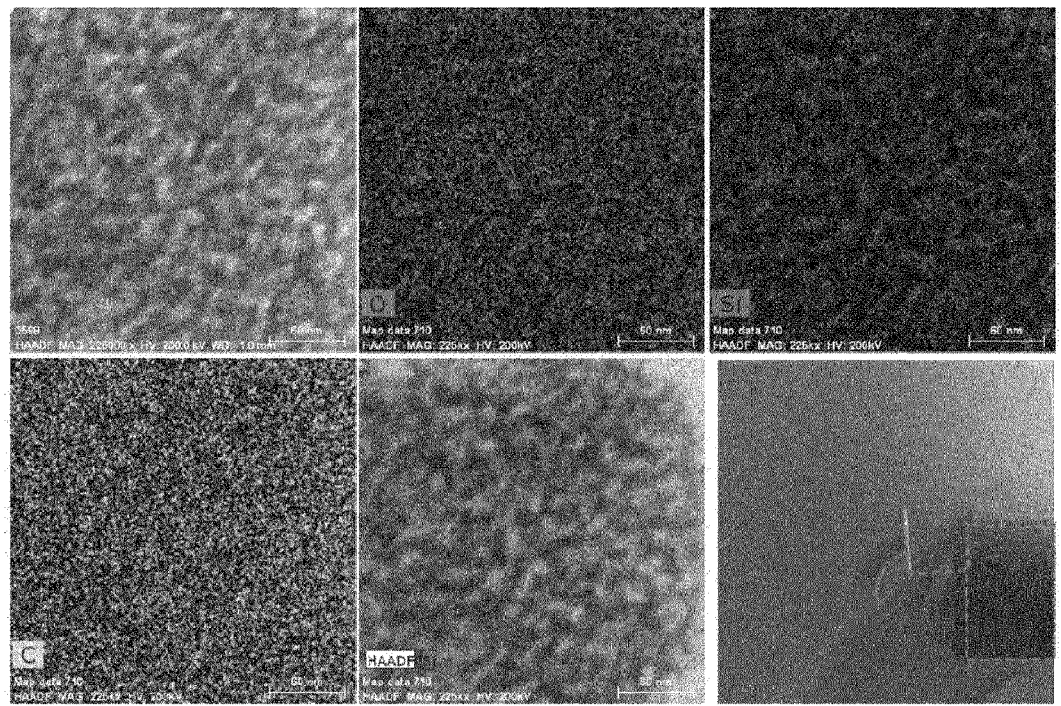

[Fig. 7]
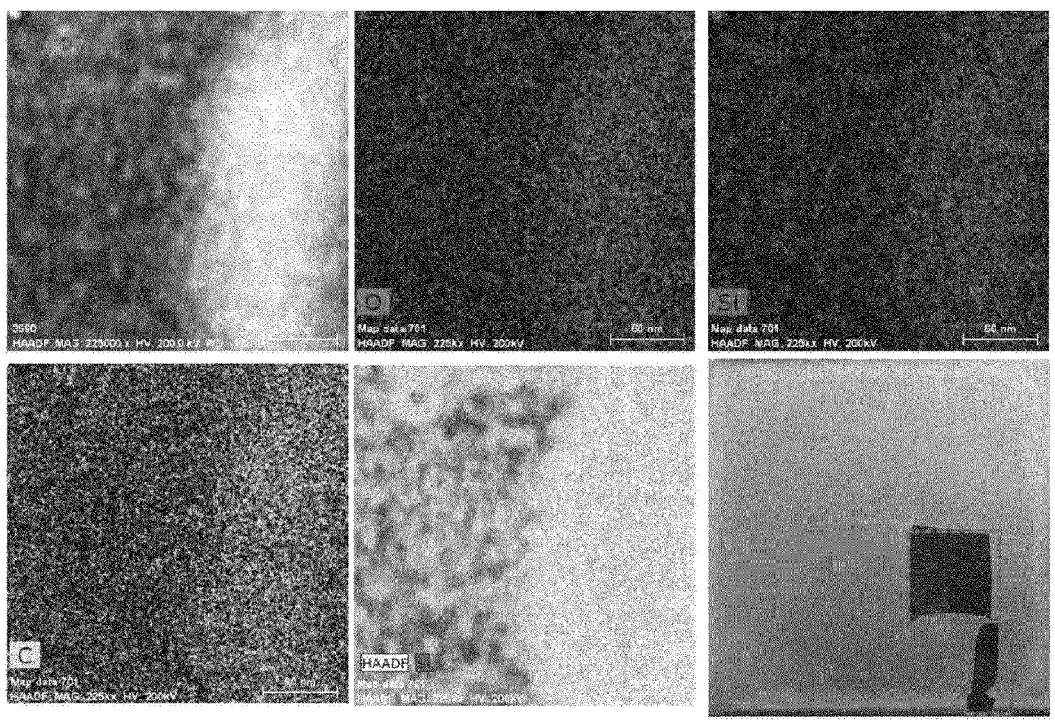

POLYIMIDE COPOLYMER AND POLYIMIDE FILM USING SAME

This application is a 35 U.S.C. § 371 National Phase Entry Application from PCT/KR2018/008045, filed on Jul. 17, 2018, and designating the United States, which claims the benefit of priority to Korean Patent Application No. 10-2017-0118000, filed on Sep. 14, 2017, the entire disclosures of which are incorporated herein by reference.

BACKGROUND OF THE INVENTION

1. Field of the Invention

The present invention provides a polyimide copolymer for producing a polyimide film having improved heat resistance and transparency.

2. Description of the Related Art

Polyimide (PI) is a polymer having a relatively low crystallinity or mostly non-crystalline structure, which has an advantage that it is easy to synthesize, it can be formed to a thin film and it does not require a crosslinking agent for cure. Also, polyimide is a polymeric material that has excellent heat resistance and chemical resistance, excellent mechanical properties, electrical properties and dimensional stability due to its rigid chain structure in addition to its transparency. Therefore, it is widely used as electrical and electronic materials for automobiles, aerospace, flexible circuit boards, liquid crystal alignment films for LCDs, and adhesives and coatings.

Although polyimide is a high-performance polymeric material having high thermal stability, mechanical properties, chemical resistance, and electrical properties, it does not satisfy colorless transparent property which is a basic requirement for use in the display field, and its coefficient of thermal expansion should be lowered. For example, the coefficient of thermal expansion of Kapton sold by DuPont is as low as about 30 ppm/° C., but this does not meet the requirements of plastic substrates. Therefore, there are many studies to minimize the change of optical characteristics and thermal history while maintaining the basic characteristics of polyimide.

In general, an aromatic polyimide has a unique color of dark brown. The reason for this is that electrons of 6 electrons, π electrons, nonbonding unshared electron pairs present in the imide structure can be excited, which can be explained by the theory of charge transfer complex (hereinafter, referred to as CT-complex) that π electrons of benzene within the imide main chain form interchain bonds.

In general, polyimides absorb light in a visible wavelength range of from 400 nm or less to 500 nm, so that it shows complementary color of yellow to red. In order to reduce the CT-complex that is a disadvantage of the polyimide, there is a method of lowering resonance effect by introducing a functional group having relatively strong electronegativity such as trifluoromethyl ($-CF_3$), sulfone ($-SO_2$) and ether ($-O-$) into the main chain of polyimides to restrict movement of π electrons. In addition, by introducing a cycloolefin structure which is not benzene, the density of π electrons present in the main chain can be reduced to manufacture a colorless transparent polyimide film.

Meanwhile, a polyamide-imide has been widely used as an industrial material in the electrical, mechanical, electronic and aerospace fields due to its excellent properties such as thermal resistance, mechanical strength and electrical property. Also, in general, it is known that polyamide-imides have a structure different from that of polyimide and is soluble in an organic solvent, allowing for the application which requires solution casting, such as an enamel varnish, a coating agent for electrical insulation and a paint.

However, for the application in the field of display devices, it is still required to develop a polymer for a flexible display having a lower thermal expansion coefficient as well as a higher solubility, transparency and thermal stability.

SUMMARY OF THE INVENTION

A problem to be solved by the present invention is to provide a polyimide copolymer for producing a polyimide film having improved heat resistance and transparency.

Other problem to be solved by the present invention is to provide a polyimide film produced by the polyimide copolymer.

Another problem to be solved by the present invention is to provide a display device using the polyimide copolymer.

In order to solve the aforementioned problem, the present invention provides a polyimide copolymer produced by polymerizing and curing a composition comprising:

an acid dianhydride, a diamine and a dimethylsiloxane (DMS)-diphenylsiloxane(DPS) oligomer, as polymerization components; and a solvent having a positive distribution coefficient (Log P), wherein a domain of the DMS-DPS with a size of 50 nm or less is uniformly distributed in a matrix of polyimide, and a volume occupied by the DMS-DPS domain is 15 to 30% of the total volume.

According to one embodiment, the DMS-DPS oligomer may have the following structure.

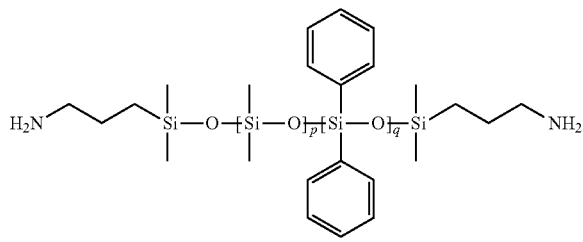

wherein, p and q are molar fractions, and when p+q=100, p is 70 to 90 and q is 10 to 30.

The solvent having a positive distribution coefficient (Log P) may be an amide-based solvent.

The amide-based solvent may be at least one selected from the group consisting of dimethylpropionamide (DMPA), diethylpropionamide (DEPA), N,N-diethylacetamide (DEAc), N,N-diethylformamide (DEF) and N-ethylpyrrolidone (NEP).

The DMS-DPS domains distributed in the polyimide matrix may have a size of from 1 nm to 50 nm, from 5 nm to 40 nm, or 10 nm to 30 nm, and are distributed in a continuous phase in a polyimide matrix.

According to one embodiment, the acid dianhydride may be selected from tetracarboxylic dianhydrides containing a tetravalent organic group of the following formulas 2a to 2 h in the molecular structure.

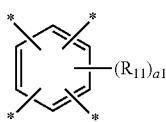
[Formula 2a]

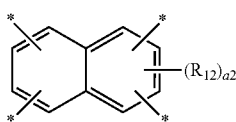
[Formula 2b]

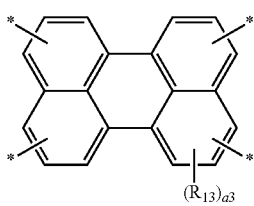
[Formula 2c]

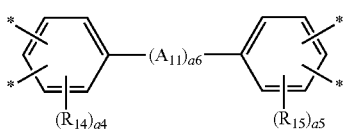
[Formula 2d]

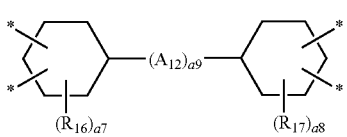
[Formula 2e]

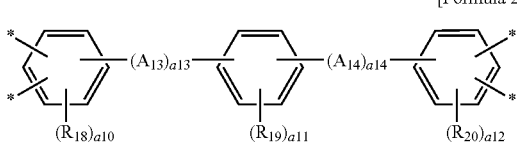
[Formula 2f]

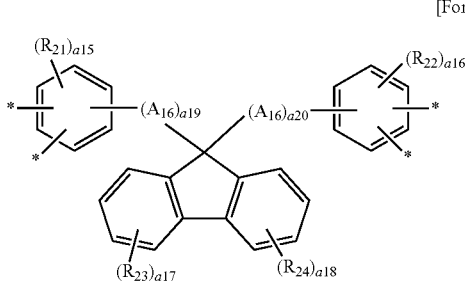
[Formula 2g]

[Formula 2h]

In the formulas 2a to 2 h, $R_{11}$ to $R_{24}$ are each independently a substituent selected from a halogen atom selected from the group consisting of —F, —Cl, —Br and —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms, a1 is an integer of 0 to 2, a2 is an integer of 0 to 4, a3 is an integer of 0 to 8, a4 and a5 are each independently an integer of 0 to 3, a7 and a8 are each independently an integer of 0 to 3, a10 and a12 are each independently an integer of 0 to 3, a11 is an integer of 0 to 4, a15 and a16 are each independently an integer of 0 to 4, a17 and a18 are each independently an integer of 0 to 4, and a6, a9, a13, a14, a19 and a20 are each independently an integer of 0 to 3, n is an integer of 1 to 3, and $A_{11}$ to $A_{16}$ are each independently selected from the group consisting of —O—, —CR'R"—, —C(=O)—, —C(=O)O—, —C(=O)NH—, —S—, —SO$_2$—, a phenylene group and a combination thereof, wherein R' and R" are each independently selected from the group consisting of a hydrogen atom, an alkyl group having 1 to 10 carbon atoms and a fluoroalkyl group having 1 to 10 carbon atoms.

According to one embodiment, the diamine containing a structure of the following formula 3 may be included in an amount of 80 to 99 mol % based on the total diamines.

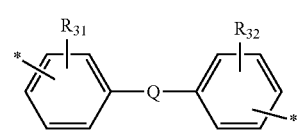
[Formula 3]

In the formula 3, $R_{31}$ and $R_{32}$ are each independently a substituent selected from a halogen atom selected from the group consisting of —F, —Cl, —Br and —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms, Q may be selected from a single bond, —O—, —CR'R"—, —C(=O)—, —C(=O)O—, —C(=O)NH—, —S—, —SO$_2$—, a phenylene group and a combination thereof, wherein R' and R" are each independently selected from the group consisting of a hydrogen atom, an alkyl group having 1 to 10 carbon atoms and a fluoroalkyl group having 1 to 10 carbon atoms.

According to one embodiment, the tetracarboxylic dianhydride of the following formula 4 may be included in an amount of 20 to 80 mol % based on the total tetracarboxylic dianhydrides.

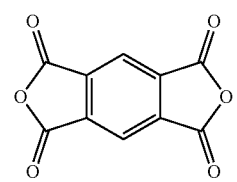
[Formula 4]

According to one embodiment, the tetracarboxylic dianhydride of the following formula 5 may be included in an amount of 20 to 80 mol % based on the total tetracarboxylic dianhydrides.

[Formula 5]

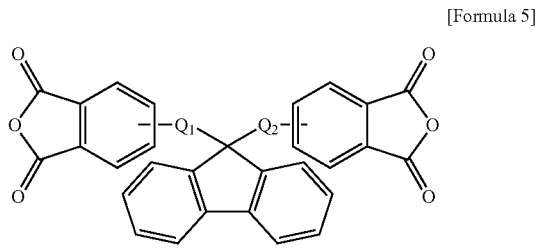

In the formula 5, $Q_1$ and $Q_2$ are each independently selected from the group consisting of a single bond, —O—, —C(=O)—, —C(=O)O—, —C(=O)NH—, —S—, —SO$_2$—, a phenylene group and a combination thereof.

According to one embodiment, the tetracarboxylic dianhydrides of the following formulas 4 and 5 are included together.

[Formula 4]

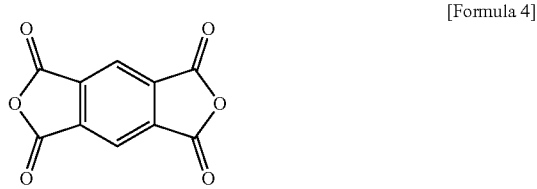 [SMILES: O=c1oc(=O)c2cc3c(=O)oc(=O)c3cc12]

[Formula 5]

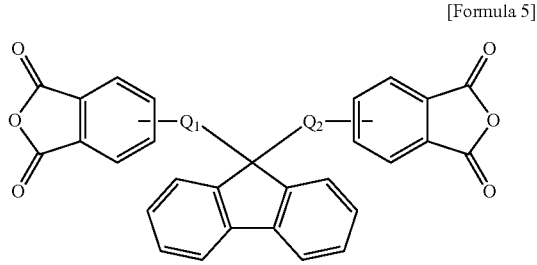

In the formula 5, $Q_1$ and $Q_2$ are each independently selected from the group consisting of a single bond, —O—, —C(=O)—, —C(=O)O—, —C(=O)NH—, —S—, —SO$_2$—, a phenylene group and a combination thereof.

In order to solve other problem of the present invention, there is provided a polyimide film produced from the polyimide copolymer.

According to one embodiment, the haze of the polyimide film may be 2 or less.

According to one embodiment, the Tg of the polyimide film may be 350° C. or higher.

According to one embodiment, the CTE of the polyimide film may be less than 100 ppm/° C.

The present invention also provides a transparent polyimide substrate for an oxide TFT or an LTPS produced from the polyimide copolymer.

Effect of the Invention

According to the present invention, a polyimide copolymer prepared by polymerizing and curing a polymerization component containing a diamine (DMS-DPS) having a high molecular weight siloxane structure in the presence of an organic solvent having a positive Log P is distributed as a continuous phase of DMS-DPS in a nano-size scale, so that residual stress can be effectively reduced while maintaining heat resistance and mechanical properties. Therefore, it is suitable for a high heat resistant and low stress polymer material. Therefore, it can be used in various fields such as a substrate for devices, a cover substrate for displays, an optical film, an IC (integrated circuit) package, an adhesive film, a multilayer flexible printed circuit (FPC), a tape, a touch panel, a protective film for optical discs.

BRIEF DESCRIPTION OF THE DRAWINGS

FIGS. 1(a)-1(b) are schematic views for explaining the structure of a copolymer according to the present invention.

FIGS. 2(a) to 2(d) are TEM images of cross-section of the polyimide film according to Example 2 at various magnifications at various positions.

FIGS. 3(a) and 3(b) show a distribution of Si by component analysis with STEM (scanning transmission electron microscope) HAADF (high-angle annular dark-field imaging) and EDS (energy dispersive spectrometer) mapping for bright and dark regions of the polyimide film according to Example 2.

FIGS. 4(a) to 4(d) are TEM images of cross-sections of the polyimide film according to Comparative Example 1 at various magnifications at various positions.

FIGS. 5(a) and 5(b) show a distribution of Si by component analysis with STEM HAADF and EDS mapping for bright and dark regions of the polyimide film according to Comparative Example 1.

FIGS. 6 and 7 show the results of EDS component analysis of a film produced from the copolymer of Example 2 and Comparative Example 1, respectively.

DETAILED DESCRIPTION OF THE INVENTION

Since various modifications and variations can be made in the present invention, particular embodiments are illustrated in the drawings and will be described in detail in the detailed description. It should be understood, however, that the invention is not intended to be limited to the particular embodiments, but includes all modifications, equivalents, and alternatives falling within the spirit and scope of the invention. In the following description of the present invention, detailed description of known functions will be omitted if it is determined that it may obscure the gist of the present invention.

In the present disclosure, all compounds or organic groups may be substituted or unsubstituted, unless otherwise specified. Herein, the term "substituted" means that at least one hydrogen contained in the compound or the organic group is substituted with a substituent selected from the group consisting of a halogen atom, an alkyl group having 1 to 10 carbon atoms, a halogenated alkyl group, a cycloalkyl group having 3 to 30 carbon atoms, an aryl group having 6 to 30 carbon atoms, a hydroxyl group, an alkoxy group having 1 to 10 carbon atoms, a carboxylic group, an aldehyde group, an epoxy group, a cyano group, a nitro group, an amino group, a sulfonic group or a derivative thereof.

In the present disclosure, "a combination thereof" means, unless otherwise specified, that at least two functional groups are bonded by a linking group such as a single bond, a double bond, a triple bond, an alkylene group having 1 to 10 carbon atoms (for example, a methylene group (—CH$_2$—), an ethylene group (—CH$_2$CH$_2$—, etc.), a fluoroalkylene group (e.g., fluoromethylene group (—CF$_2$—), perfluoroethylene group (—CF$_2$CF$_2$—), etc.), a hetero atom such as N, O, P, S or Si or a functional group containing the hetero atom (e.g., a heteroalkylene group containing a carbonyl group (—C=O—), an ether group (—O—), an ester group (—COO—), —S—, —NH— or —N=N—), or two or more functional groups are condensed and connected to each other.

Flexible devices involving high temperature processes are required to have high temperature resistance, especially in the case of an Oxide TFT and an OLED (organic light emitting diode) device prepared by using low temperature polycrystalline silicon (LTPS) processes, the process temperature may approach 350° C. or more to 500° C.

Even at such a temperature, polyimide having excellent heat resistance tends to be thermally decomposed, and may shrink or expand due to heat. Therefore, in order to manufacture flexible devices, it is necessary to develop a polyimide which can exhibit excellent thermal stability while maintaining high transparency at a high temperature with excellent mechanical properties.

The present invention provides a polyimide copolymer prepared by polymerizing and curing a composition comprising:

an acid dianhydride, a diamine and a dimethylsiloxane (DMS)-diphenylsiloxane(DPS) oligomer, as polymerization components; and a solvent having a positive distribution coefficient (Log P) at 25° C., wherein a domain of the DMS-DPS with a size of 50 nm or less is uniformly distributed in a matrix of polyimide, and a volume occupied by the DMS-DPS domain is 15 to 30% of the total volume. The size of the DMS-DPS domain is preferably from 1 nm to 50 nm, from 5 nm to 40 nm, or 10 nm to 30 nm, for uniform distribution.

According to one embodiment, the DMS-DPS oligomer may have the following structure.

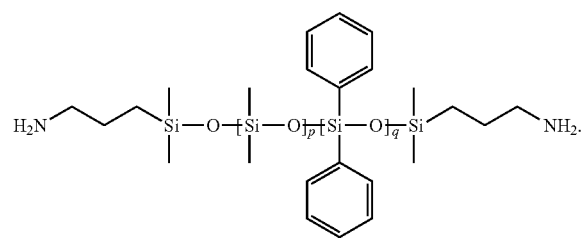

wherein, p and q are molar fractions, and when p+q=100, p is 70 to 90 and q is 10 to 30.

The solvent having a positive distribution coefficient (Log P) at 25° C. may be an amide-based solvent.

The amide-based solvent may be at least one selected from the group consisting of dimethylpropionamide (DMPA), diethylpropionamide (DEPA), N,N-diethylacetamide (DEAc), N,N-diethylformamide (DEF) and N-ethylpyrrolidone (NEP).

According to the present invention, the DMS-DPS domain distributed in the polyimide matrix has a continuous phase with a nano-size scale such as 1 nm to 50 nm, 5 nm to 40 nm, or 10 nm to 30 nm, so that it is possible to minimize residual stress while maintaining heat resistance and mechanical properties. In the case of not having such a continuous phase, although reduction effect of residual stress may be obtained, heat resistance and mechanical properties are remarkably reduced and, therefore, it is difficult to be processed.

Herein, the DMS-DPS domain refers to a portion that polymers having the DMS-DPS structure are distributed, and the size thereof refers to a diameter of an imaginary circle surrounding the portion.

It is preferable that the portions (domains) including the DMS-DPS structure are connected in a continuous phase in the polyimide matrix, wherein the continuous phase means a shape in which nano-sized domains are uniformly distributed.

Accordingly, in the present invention, even though DMS-DPS has a high molecular weight, it can be uniformly distributed in the polyimide matrix without phase separation, resulting in a polyimide having lower haze and more transparent characteristics. In addition, since the DMS-DPS structure is present in a continuous phase, mechanical strength and stress relaxation effect of the polyimide can be improved more efficiently. From these characteristics, the composition according to the present invention can provide a flat polyimide film having a reduced bending phenomenon of the substrate after coating and curing while maintaining thermal and optical properties.

The present invention can provide a polyimide film which is colorless, more transparent and excellent in heat resistance, by preparing a polyimide by polymerizing in an organic solvent having a positive distribution coefficient (Log P) at 25° C. using a diamine containing Si structure having a high molecular weight.

According to one embodiment, the copolymer may be produced by curing a polyimide precursor composition comprising a polyimide precursor prepared by using, as polymerization components, a diamine having a molecular weight of 4000 g/mol or more and containing the structure of the following formula in the molecular structure and at least one tetracarboxylic dianhydride t; and an organic solvent having a positive Log P:

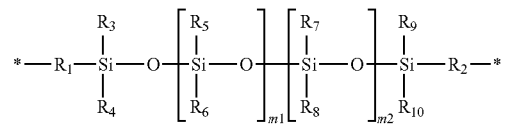

wherein, $R_1$ and $R_2$ are each independently a single bond, an alkylene group having 1 to 5 carbon atoms or a divalent aromatic group having 6 or more carbon atoms, $R_3$, $R_4$, $R_5$ and $R_6$ are each independently an alkyl group having 1 to 5 carbon atoms, $R_7$, $R_8$, $R_9$ and $R_{10}$ are each independently a phenyl group, m1 and m2 are each independently an integer of 1 or more, the symbol * represents a linking site.

According to a preferred embodiment, the diamine of the above formula has the structure of the following formula 1.

[Formula 1]

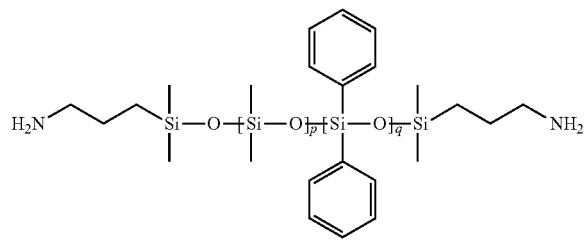

wherein, p and q are molar fractions, and when p+q=100, p is 70 to 90 and q is 10 to 30.

A molecular weight of the diamine having the structure of formula 1 may be 4000 g/mol or more, preferably 4400 g/mol or more, and more preferably 5000 g/mol or more. Herein, the molecular weight means a weight average molecular weight which can be calculated by calculating amine equivalent using NMR analysis or acid-base titration.

When the molecular weight of the diamine having the structure of formula 1 is less than 4000 g/mol, the heat resistance may be lowered. For example, when the glass transition temperature (Tg) of the resulting polyimide may be decreased or the thermal expansion coefficient may be excessively increased.

According to one embodiment of the present invention, one or more diamines may be used. The diamine of formula 1 may be contained in an amount of 1 to 20 mol %, preferably 1 to 10 mol % of the total diamines.

According to one embodiment, the diamine of formula 1 may be added in an amount of from 10 to 50% by weight, based on the total solid content of the polyimide copolymer, that is, the weight of the solid content of the polyimide precursor or the total weight of the polymerization components (diamine and acid dianhydride), preferably 10 to 40% by weight. If the diamine comprising the structure of formula 1 is added in an excessive amount relative to the total weight of the polymer, for example, in an amount of 50 wt % or more, or 40 wt % or more, mechanical properties such as modulus of the polyimide may be decreased and the film strength may be reduced, so that physical damage such as film tearing during the processing can occur. If the diamine having the structure of formula 1 is added in excess, it has a glass transition temperature (Tg) which is derived from the oligomer having the siloxane structure. From this, a glass state may be appeared at a low process temperature of 350° C. or lower. During deposition of inorganic film at 350° C. or higher, wrinkles may be generated on the surface of the film and the inorganic film may be cracked due to flow phenomenon of polymer.

As the solvent that can be used in the present invention, it is preferable to use an organic solvent having a positive Log P, specifically an amide-based solvent having a positive Log P value. For example, it may be at least one organic solvent selected from the group consisting of dimethylpropionamide (DMPA), diethylpropionamide (DEPA), N,N-diethylacetamide (DEAc), N,N-diethylformamide (DEF) and M-ethylpyrrolidone (NEP). Particularly, dimethylpropionamide (DMPA) and diethylpropionamide (DEPA) are preferable.

The polyimide copolymer according to the present invention can reduce the whitening phenomenon caused by the phase separation due to the difference in polarity between the flexible polyimide repeating structure into which the structure of formula 1 is introduced and the other polyimide structure, by using the organic solvent as described above. Conventionally, two kinds of organic solvents are used to solve the above-mentioned phase separation. However, in the present invention whitening phenomenon can be reduced only by using one kind of organic solvent, and thus a more transparent polyimide film can be produced.

In the present invention, by introducing the structure of formula 1 containing a siloxane structure into the polyimide structure, the modulus strength of polyimide can be improved and the stress caused by external force can be relaxed. The polyimide including the siloxane structure may exhibit polarity, and may have phase separation due to difference in polarity from the polyimide structure that does not include the siloxane structure. Thereby, the siloxane structure can be unevenly distributed throughout the polyimide structure. In this case, it is difficult to improve physical properties such as strength enhancement effect and stress relaxation effect of the polyimide by the siloxane structure, and the transparency of the film may be deteriorated because the haze is increased due to phase separation. In particular, when a diamine containing a siloxane structure has a high molecular weight, the polyimide prepared from the diamine exhibits a more pronounced polarity, so that the phase separation phenomenon between polyimides may be more marked. However, when a siloxane diamine having a low molecular weight structure is used, a large amount of the siloxane diamine should be added in order to obtain preferable effects such as stress relaxation. This may cause a process problem such as a lower glass transition temperature and thus the physical properties of the polyimide film may be deteriorated. When a siloxane diamine having a higher molecular weight is added, a relaxation segment can be largely formed in the molecule, and therefore, the stress relaxation effect can be remarkable even with a lower content as compared with a case where the siloxane diamine having a low molecular weight is added. Therefore, in the present invention, it has been studied a method for making the diamine of formula 1 containing a siloxane structure having a high molecular weight to be distributed more evenly in a polyimide matrix without phase separation.

In order to solve the above problem, there is a method of using a polar solvent and a nonpolar solvent in combination. However, in the case of a polar solvent, volatility tends to be high, and therefore problems such as volatilization may occur in the manufacturing process. From this, the reproducibility of the polyimide film may be lowered. In addition, the problem of phase separation may not be completely solved, and the haze of the produced polyimide film may increase and the transparency may be lowered. In the present invention, in order to uniformly distribute the polyimide structure having the structure of formula 1 in the overall polyimide matrix, a solvent having a positive Log P is used. In particular, an amine-based solvent having a positive Log P is used. More specifically, by using a solvent having amphipathic molecular structure, it is possible not only to solve process problems due to use of a polar solvent, but also to solve the problem caused by the phase separation because the polyimide can be evenly distributed even if only one type of solvent is used, owing to the amphipathic molecular structure. As a result, polyimide having significantly improved haze characteristics can be provided.

According to one embodiment, the tetracarboxylic dianhydride may be selected from tetracarboxylic dianhydrides containing a tetravalent organic group of the following formulas 2a to 2 h in the molecular structure.

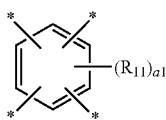

[Formula 2a]

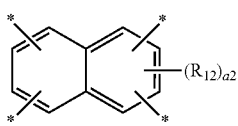

[Formula 2b]

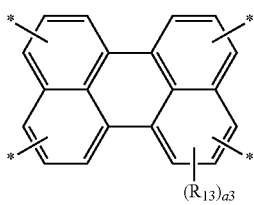

[Formula 2c]

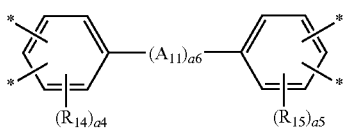

[Formula 2d]

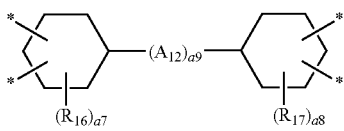

[Formula 2e]

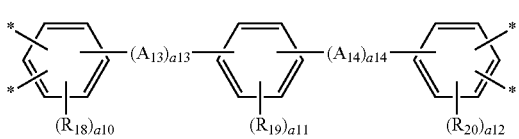

[Formula 2f]

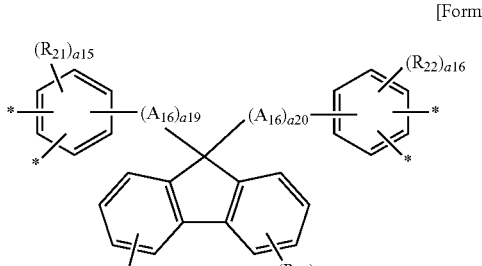

[Formula 2g]

[Formula 2h]

In the formulas 2a to 2 h, $R_{11}$ to $R_{24}$ are each independently a substituent selected from a halogen atom selected from the group consisting of —F, —Cl, —Br and —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms, a1 is an integer of 0 to 2, a2 is an integer of 0 to 4, a3 is an integer of 0 to 8, a4 and a5 are each independently an integer of 0 to 3, a7 and a8 are each independently an integer of 0 to 3, a10 and a12 are each independently an integer of 0 to 3, a11 is an integer of 0 to 4, a15 and a16 are each independently an integer of 0 to 4, a17 and a18 are each independently an integer of 0 to 4, and a6, a9, a13, a14, a19 and a20 are each independently an integer of 0 to 3, n is an integer of 1 to 3, and $A_{11}$ to $A_{16}$ are each independently selected from the group consisting of —O—, —CR'R''—, —C(=O)—, —C(=O)O—, —C(=O)NH—, —S—, —SO$_2$—, a phenylene group and a combination thereof, wherein R and R'' are each independently selected from the group consisting of a hydrogen atom, an alkyl group having 1 to 10 carbon atoms and a fluoroalkyl group having 1 to 10 carbon atoms.

In the present invention, as diamines other than the diamine of formula 1, diamines containing a divalent organic group of the following formula 3 in the molecular structure is included in an amount of 80 to 99 mol % based on the total diamines.

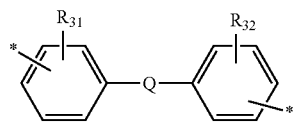

[Formula 3]

In the formula 3, $R_{31}$ and $R_{32}$ are each independently a substituent selected from a halogen atom selected from the group consisting of —F, —Cl, —Br and —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms, preferably a substituent selected from a halogen atom, a halogenoalkyl group, an alkyl group, an aryl group and a cyano group. For example, the halogen atom may be fluoro (—F), the halogenoalkyl group may be a fluoroalkyl group having 1 to 10 carbon atoms containing a fluoro atom, for example selected from a fluoromethyl group, a perfluoroethyl group and a trifluoromethyl group, the alkyl group may be selected from a methyl group, an ethyl group, a propyl group, an isopropyl group, a t-butyl group, a pentyl group and a hexyl group, and the aryl group may be selected from a phenyl group and a naphthalenyl group. More preferably, they may be substituted with a fluoro atom or a substituent containing a fluoro atom such as a fluoroalkyl group.

Q may be selected from a single bond, —O—, —CR'R''—, —C(=O)—, —C(=O)O—, —C(=O)NH—, —S—, —SO$_2$—, a phenylene group and a combination thereof, wherein R' and R'' are each independently selected from the group consisting of a hydrogen atom, an alkyl group having 1 to 10 carbon atoms and a fluoroalkyl group having 1 to 10 carbon atoms.

Herein, the "fluoro-based substituent" of the present invention means "a fluoro atom substituent" as well as "a substituent containing a fluoro atom".

The diamine of formula 3 may be selected from compounds represented by the following formulas 3a to 3d.

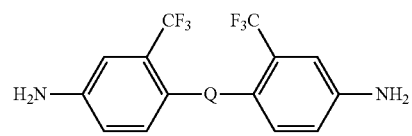

(3a)

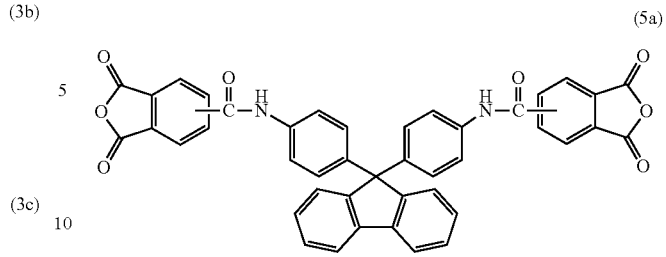

(3b)

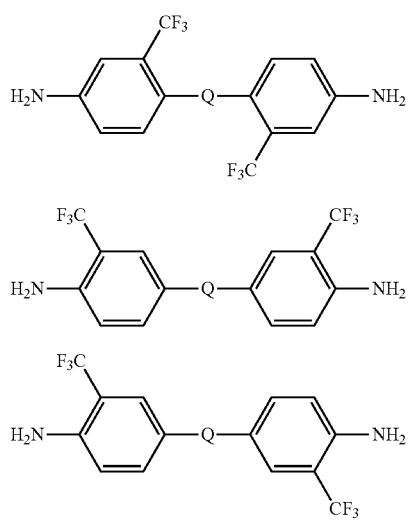

(3c)

(3d)

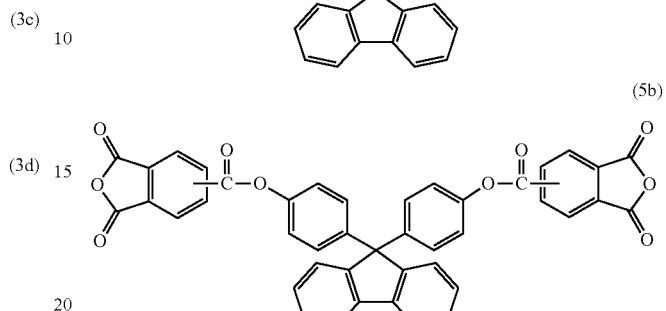

(5a)

(5b)

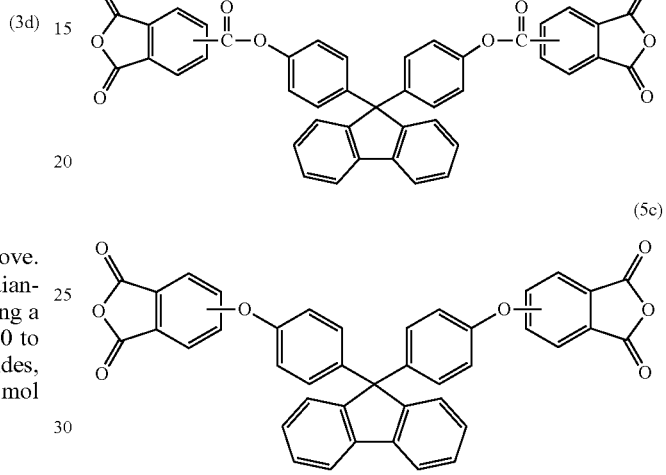

(5c)

(5d)

In the formulas 3a to 3d, Q is the same as described above.

According to one embodiment, the tetracarboxylic dianhydride may contain a tetracarboxylic dianhydride having a structure of the following formula 4 in an amount of 20 to 80 mol % based on the total tetracarboxylic dianhydrides, preferably 30 to 80 mol %, and more preferably 30 to 70 mol %.

[Formula 4]

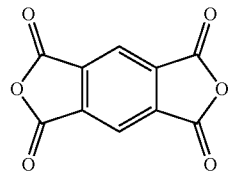

According to one embodiment, the tetracarboxylic dianhydride may contain a tetracarboxylic dianhydride having a structure of the following formula 5 in an amount of 20 to 80 mol % based on the total tetracarboxylic dianhydrides, preferably 20 to 60 mol %, and more preferably 20 to 50 mol %.

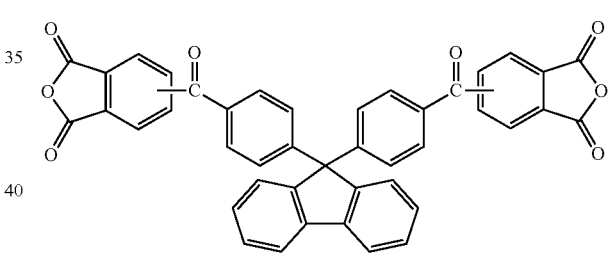

[Formula 5]

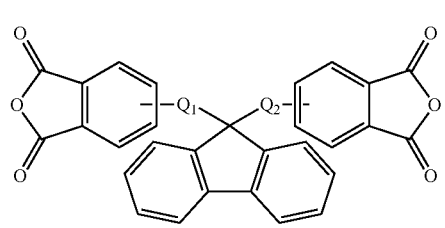

(5e)

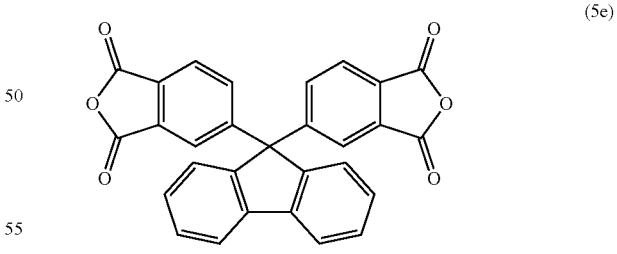

In the formula 5, $Q_1$ and $Q_2$ are each independently selected from the group consisting of a single bond, —O—, —C(=O)—, —C(=O)O—, —C(=O)NH—, —S—, —$SO_2$—, a phenylene group and a combination thereof.

According to one embodiment, the compound of formula 5 may be any one of compounds of following formulas 5a to 5e.

By including the repeating structure containing the fluorene structure in the polyimide structure, the retardation in the thickness direction of the film can be reduced.

In the present invention, at least one selected from the tetracarboxylic dianhydrides including the tetravalent organic group of the following formulas 6a to 6r may be used together with the tetracarboxylic dianhydrides of the formula 4 or 5.

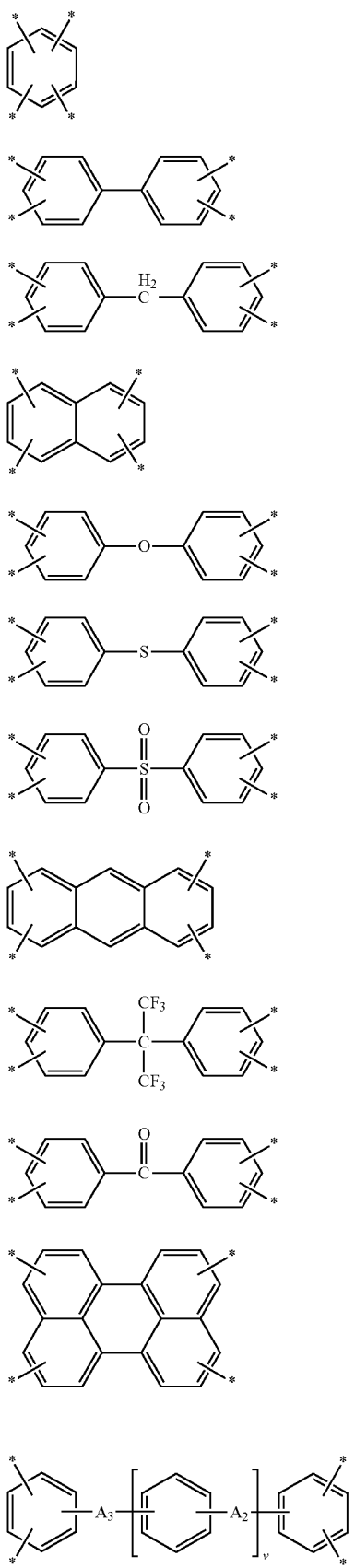
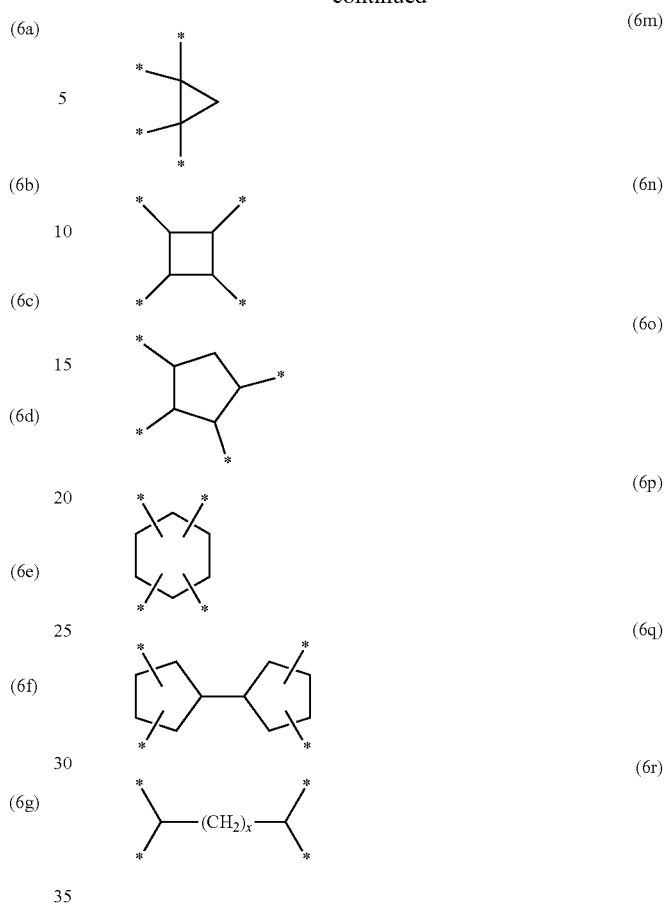

In the formula 61, A2 may be selected from the group consisting of a single bond, —O—, —C(=O)—, —C(=O)NH—, —S—, —SO$_2$—, a phenylene group and a combination thereof, and v is an integer of 0 or 1, and in the formula 6r, x is an integer of 1 to 10.

At least one hydrogen atom present in the tetravalent organic group of the formulas 6a to 6r may be substituted with a substituent selected from a halogen atom selected from the group consisting of —F, —Cl, —Br and —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms.

Alternatively, in the present invention, the tetracarboxylic dianhydrides of the formulas 4 and 5 may be used together. When the tetracarboxylic dianhydrides of the formulas 4 and 5 are used together, the content of the tetracarboxylic dianhydride of the formula 5 may be in the range of 10 to 30 mol %, preferably 10 to 25 mol %, more preferably 15 to 25 mol % with respect to the total content of the tetracarboxylic dianhydrides. By using the compound of formula 5 containing a fluorene structure together with the compound of formula 4 in the production of the polyimide, the shrinkage in the plane direction due to heat is alleviated. Thus, shrinkage phenomenon of the film appeared during a cooling step after a heating step can be improved and heat resistance such as a glass transition temperature can be enhanced.

According to one embodiment of the present invention, the total content of the tetracarboxylic dianhydride and the content of the diamine may be in a molar ratio of 1:1.1 to 1.1:1. In order to improve reactivity and processability, it is preferred that the total content of the tetracarboxylic dianhydride is excessive relative to the diamine, or the content of the diamine is excessive relative to the total content of the tetracarboxylic dianhydride.

According to one embodiment of the present invention, it is preferable that the molar ratio of the total content of the tetracarboxylic dianhydride to the content of the diamine is 1:0.99 to 0.99:1, preferably 1:0.98 to 0.98:1.

The organic solvent that can be used in the polymerization reaction may have a positive distribution coefficient (Log P value) at 25° C. and a boiling point of 180° C. or less. More specifically, the distribution coefficient, Log P value may be 0.01 to 3, 0.01 to 2, or 0.1 to 2.

The distribution coefficient can be calculated using an ACD/Log P module of ACD/Percepta platform from ACD/Labs. The ACD/Log P module uses an algorithm based on QSPR (Quantitative Structure-Property Relationship) methodology using 2D molecular structures.

A positive distribution coefficient value means that the polarity of solvent is hydrophobic. According to the studies of the present inventors, if a specific solvent having a positive distribution coefficient is used to prepare a polyimide precursor composition, dewetting phenomenon of the solution can be improved. Furthermore, by using the solvent having a positive Log P value as described above, it is possible to control dewetting phenomenon of the solution without using additives for controlling a surface tension or a smoothness of the coating film, such as a leveling agent. Since an additional material such as an additive is not used, it is possible to eliminate problems of quality and process such as inclusion of a low-molecular substance in a final product, and to form a polyimide film having uniform properties more efficiently.

For example, in the process of coating a polyimide precursor composition on a glass substrate, dewetting of the solution may be occurred due to shrinkage of the coating layer during curing or when leaving the coating solution under humidity condition. This dewetting phenomenon of the coating solution leads to a variation in the film thickness, resulting in insufficient bending resistance of the film. Therefore, film breakage may occur or edge cracking may appear when cutting. That is, there may be problems of poor processability and lowered yield.

If polar fine foreign substances are introduced to the substrate on which the polyimide precursor solution containing a polar solvent having a negative Log P is coated, the polarity of the foreign substances may cause sporadic coating cracks or thickness change around the portions where the foreign substances exist. On the contrary, when a hydrophobic solvent having a positive Log P is used, coating cracks, thickness changes, or the like can be reduced or suppressed even if polar fine foreign substances are introduced.

Specifically, the polyimide precursor composition comprising a solvent having a positive Log P may have a dewetting ratio of 0% to 0.1% or less as defined by the following Equation 1:

$$\text{Dewetting ratio (\%)}=[(A-B)/A]\times 100 \quad \text{[Equation 1]}$$

wherein,

A: area measured when the polyimide precursor composition is fully coated on a substrate (100 mm×100 mm), B: area measured after dewetting phenomenon occurs from the end of edge of a substrate coated with polyimide precursor composition or PI film.

The dewetting phenomenon of the polyimide precursor composition and the film may occur within 30 minutes after coating the solution of the polyimide precursor composition. In particular, the edges are thickened as beginning of dewetting from edges.

After coating the substrate with the polyimide precursor composition according to the present invention and then leaving in a humidity condition for 10 minutes or more, for example, 10 minutes or more, for example, 40 minutes or more, the dewetting ratio is 0.1% or less. For example, even after leaving at a temperature of 20 to 30° C. and under a humidity condition of 40% or more, more specifically a humidity condition of 40% to 80%, that is, 40%, 50%, 60%, 70%, 80%, for example a humidity condition of 50% for 10 to 50 minutes, a very low dewetting ratio of 0.1% or less may be exhibited, preferably 0.05%, more preferably nearly 0%.

The above dewetting ratio is maintained even after curing. For example, after the polyimide precursor composition is coated on the substrate and then left for 10 minutes or more, for example, at a temperature of 20 to 30° C. and under a humidity condition of 40% or more, more specifically a humidity condition of 40% to 80%, that is, 40%, 50%, 60%, 70%, 80%, for example a humidity condition of 50% for 10 to 50 minutes, the dewetting ratio of the cured polyimide film may be 0.1% or less, that is, the dewetting can be hardly occurred or can be disappeared even in the curing process by heat treatment, and specifically the dewetting ratio may be 0.05%, more preferably nearly 0%.

The polyimide precursor composition according to the present invention can solve this dewetting phenomenon, thereby making it possible to obtain a polyimide film having more uniform characteristics and further improve the yield of the production process.

In addition, the density of the solvent according to the present invention can be 1 g/cm$^3$ or less as measured by standard ASTM D1475. If the density is more than 1 g/cm$^3$, the relative viscosity may be increased and the efficiency of the process may be reduced.

The reaction of tetracarboxylic dianhydride and diamine may be carried out by a conventional polymerization method of polyimide precursor, such as solution polymerization. Specifically, diamine is dissolved in an organic solvent and then is subjected to a polymerization reaction by adding tetracarboxylic dianhydride.

According to one embodiment, it may be polymerized by the method comprising the steps of:

a) introducing a diamine of formula 1 into an organic solvent;

b) introducing a diamine of formula 3 into the solution prepared in the step a);

c) introducing at least one tetracarboxylic dianhydride in the solution prepared in the step b); and d) polymerizing the solution prepared in the step c) at a predetermined reaction temperature.

The reaction may be carried out in an inert gas or a nitrogen stream, and may be carried out under anhydrous conditions.

The reaction temperature during the polymerization reaction may be −20 to 80° C., preferably 0 to 80° C. If the reaction temperature is too high, the reactivity may become high, the molecular weight may become large, and the viscosity of the precursor composition may increase, which may be unfavorable in the process.

It is preferred that the polyimide precursor composition contains a solid content in an amount such that the composition has an appropriate viscosity in consideration of coating properties during a film-forming step, and the like. According to one embodiment, the content of the composition may be adjusted so that the total content of polyimide precursor is from 8 to 25% by weight, preferably from 10 to 25% by weight, more preferably from 10 to 20% by weight or less.

Alternatively, the polyimide precursor composition may be adjusted to have a viscosity of 3,000 cP or more, or 4,000 cP or more. The viscosity of the polyimide precursor composition is 10,000 cP or less, preferably 9,000 cP or less, more preferably 8,000 cP or less. When the viscosity of the polyimide precursor composition exceeds 10,000 cP, the efficiency of defoaming during processing the polyimide film is lowered. It results in not only the lowered efficiency of process but also the deteriorated surface roughness of the produced film due to bubble generation. It may lead to the deteriorated electrical, optical and mechanical properties.

The polyimide according to the present invention may have a weight average molecular weight of 10,000 to 200,000 g/mol, or 20,000 to 100,000 g/mol, or 30,000 to 100,000 g/mol. The molecular weight distribution (Mw/Mn) of the polyimide according to the present invention is preferably 1.1 to 2.5. When the weight average molecular weight or the molecular weight distribution of the polyimide is out of the above range, there may be a difficulty in film formation or the properties of polyimide film such as transmittance, heat resistance and mechanical properties may be deteriorated.

Then, the obtained polyimide precursor as a result of the polymerization reaction may be imidized to prepare a transparent polyimide film. At this time, the imidization process may be specifically a chemical imidization or thermal imidization process.

For example, after adding a dehydrating agent and an imidization catalyst to a polymerized polyimide precursor composition, the polymerized polyimide precursor composition is heated at a temperature of 50 to 100° C. and imidized by a chemical reaction, or the solution is refluxed to remove an alcohol and imidized to obtain polyimide.

In the chemical imidization method, pyridine, triethylamine, picoline or quinoline may be used as an imidization catalyst. In addition, a substituted or unsubstituted nitrogen-containing heterocyclic compound, an N-oxide compound of the nitrogen-containing heterocyclic compound, a substituted or unsubstituted amino acid compound, an aromatic hydrocarbon compound having a hydroxyl group or an aromatic heterocyclic compound, and particularly, lower alkylimidazole such as 1,2-dimethylimidazole, N-methylimidazole, N-benzyl-2-methylimidazole, 2-methylimidazole, 2-ethyl-4-methylimidazole and 5-methylbenzimidazole, isoquinoline, substituted pyridine such as, 3,5-dimethylpyridine, 3,4-dimethylpyridine, 2,5-dimethylpyridine, 2,4-dimethylpyridine and 4-n-propylpyridine, and p-toluenesulfonic acid, may be used.

As the dehydrating agent, an acid anhydride such as acetic anhydride may be used.

Alternatively, the polyimide precursor composition may be coated on a substrate and heat treated to be imidized.

The polyimide precursor composition may be in the form of a solution in which the polyimide precursor is dissolved in an organic solvent. For example, when the polyimide precursor is synthesized in an organic solvent, the solution may be the reaction solution as obtained, or may be obtained by diluting this reaction solution with another solvent. When the polyimide precursor is obtained as a solid powder, it may be dissolved in an organic solvent to prepare a solution.

The present invention provides a method for producing a polyimide film comprising the steps of:
applying the polyimide precursor solution onto a substrate; and
heat treating the applied polyimide precursor solution.

The polyimide precursor composition is applied on a substrate and heat-treated in an IR oven, in a hot air oven, or on a hot plate. The heat treatment temperature may range from 300 to 500° C., preferably from 320 to 480° C. The heat treatment may be performed in a multi-step heating process within the above temperature range. The heat treatment process may be performed for 20 to 70 minutes, and preferably for 20 to 60 minutes.

The organic solvent contained in the polyimide precursor composition of the present invention may be the same as the organic solvent used in the polymerization reaction.

In the present invention, a silane coupling agent, a cross-linkable compound, an imidization accelerator for promoting imidization efficiently, and the like may be added as long as the effect is not impaired.

In addition, the polyimide-based film may have a haze of 2 or less, preferably 1 or less, or 0.9 or less, thereby providing a polyimide film with improved transparency. At this time, the thickness of the polyimide film may be 8 to 15 μm, preferably 10 to 12 μm.

Also, it may be a transparent colorless polyimide film having a transmittance to light in a wavelength range of 380 to 760 nm of 80% or more in the film thickness of 5 to 30 μm and a yellowness index (YI) of about 15 or less, preferably about 10 or less, more preferably about 8 or less. By having excellent light transmittance and yellowness as described above, it is possible to exhibit significantly improved transparency and optical characteristics.

The polyimide-based film has an in-plane retardation (Rin) of about 0 to 100 nm, a retardation value (Rth) in the thickness direction of about 1000 nm or less, or 0 to 700 nm, preferably 0 to 600 nm, more preferably from 0 to 500 nm. In the above range of the retardation in the thickness direction, visual sensibility suitable for the display may exhibit. If the retardation in the thickness direction is 1000 nm or more, a phase difference is generated in the polyimide film, and the light is distorted, so that the visibility may be remarkably lowered.

The polyimide film according to the present invention may have a glass transition temperature (Tg) of 350° C. or higher, preferably 360° C. or higher, and more preferably 370° C. or higher.

The polyimide film according to the present invention may have excellent thermal stability depending on a temperature change. For example, it may have a thermal expansion coefficient of −10 to 100 ppm/° C., preferably from −7 to 90 ppm/° C., more preferably 80 ppm/° C. or less, after the n+1 times heating and cooling processes in a temperature range of 100 to 400° C.

In another embodiment of the present invention, there is provided a molded article comprising the polyimide copolymer.

The molded article may be a film, a fiber, a coating material, an adhesive material, and the like, but is not limited thereto. The molded article may be formed by a dry-wet method, a dry method, a wet method, or the like using a composite composition of the copolymer and inorganic particles, but is not limited thereto. Specifically, as described above, the molded article may be an optical film and, in this case, it may be manufactured easily by applying the composition containing the polyimide copolymer to a substrate by a method such as spin coating, and then drying and curing.

The polyimide according to the present invention can maintain the characteristics such as heat resistance and mechanical strength as it is due to the rigid structure, particularly it can exhibit excellent heat resistance against thermal shrinkage behavior that may occur during a high temperature process, as well as it can exhibit transparent characteristics. Therefore, it can be used as a substrate for a device, a cover substrate for a display, an optical film, an IC (integrated circuit) package, an adhesive film, a multilayer flexible printed circuit (FPC), a tape, a touch panel, a protective film for optical discs, and the like.

According to another embodiment of the present invention, there is provided a display device comprising the article. In particular, the display device includes a liquid crystal display device (LCD), an organic light emitting diode (OLED), or the like, particularly it is suitable for an OLED device using a low temperature polysilicon (LTPS) which requires a high temperature process, but is not limited thereto.

Hereinafter, embodiments of the present invention will be described in detail so that those skilled in the art can easily carry out the present invention. The present invention may, however, be embodied in many different forms and should not be construed as limited to the embodiments set forth herein.

Example 1

96 g of dimethylpropionamide (DMPA) (distribution coefficient: 0.504) was charged in a reactor equipped with a stirrer through which nitrogen gas flows, and then 0.0017 mol of both-end amine-modified DMS-DPS (molecular weight: 5000 g/mol, p=73.3, q=26.7) and 0.0304 mol of 2,2'-bis(trifluoromethyl)benzidine (TFMB) were added and dissolved while maintaining the temperature of the reactor at 25° C. At the same temperature, 0.0321 mol of pyromellitic dianhydride (PMDA) was added to the solution to which DMS-DPS and TFMB were added, and stirred for 3 hours, and then stirred at 80° C. for 4 hours.

Example 2

100 g of diethylpropionamide (DEPA) (distribution coefficient: 1.275) was charged in a reactor equipped with a stirrer through which nitrogen gas flows, and then 0.0014 mol of both-end amine-modified DMS-DPS (molecular weight: 5000 g/mol, p=73.3, q=26.7) and 0.0306 mol of 2,2'-bis(trifluoromethyl)benzidine (TFMB) were added and dissolved while maintaining the temperature of the reactor at 25° C. At the same temperature, 0.03211 mol of pyromellitic dianhydride (PMDA) was added to the solution to which DMS-DPS and TFMB were added, and stirred for 3 hours, and then stirred at 80° C. for 4 hours.

Comparative Example 1

96 g of N-methylpyrrolidone (NMP) (distribution coefficient: −0.28) was charged in a reactor equipped with a stirrer through which nitrogen gas flows, and then 0.0017 mol of both-end amine-modified DMS-DPS (diphenylsiloxane-dimethylsiloxane co-oligomer, molecular weight: 4400 g/mol, p=95.2, q=4.8) and 0.0304 mol of 2,2'-bis(trifluoromethyl)benzidine (TFMB) were added and dissolved while maintaining the temperature of the reactor at 25° C. At the same temperature, 0.0321 mol of pyromellitic dianhydride (PMDA) was added to the solution to which DMS-DPS and TFMB were added, and stirred for 3 hours, and then stirred at 80° C. for 4 hours.

Comparative Example 2

137 g of NMP (distribution coefficient: −0.28) was charged in a reactor equipped with a stirrer through which nitrogen gas flows, and then 0.0014 mol of both-end amine-modified DMS-DPS (molecular weight: 5000 g/mol, p=50.8, q=49.2) and 0.0306 mol of 2,2'-bis(trifluoromethyl)benzidine (TFMB) were added and dissolved while maintaining the temperature of the reactor at 25° C. At the same temperature, 0.03211 mol of pyromellitic dianhydride (PMDA) was added to the solution to which DMS-DPS and TFMB were added, and stirred for 3 hours, and then stirred at 80° C. for 4 hours.

Preparation Example

Each of the polyimide copolymers prepared in Examples 1 and 2 and Comparative Examples 1 and 2 was spin-coated on a glass substrate to a thickness of 9.5 to 11 μm. The glass substrate coated with the polyimide copolymer was placed in an oven, heated at a rate of 2° C./min, and cured at 80° C. for 15 minutes, at 150° C. for 30 minutes, at 220° C. for 30 minutes and at 400° C. for 1 hour. After completion of the curing process, the glass substrate was immersed in water, and the film formed on the glass substrate was peeled off and dried in an oven at 100° C. to produce a polyimide film.

Experimental Example 1—Component Analysis of Cross-Sections

A polyimide film made of the polyimide copolymer of each of Example 1 and Comparative Example 1 was subjected to epoxy molding to prepare a TEM foil. The foil was observed by STEM (scanning transmission electron microscope) HAADF (high angle annular dark field) technique without staining.

It was observed by TEM (FE-STEM, TITIAN G2 80-200 ChemiSTEM) and the analysis condition was as follows:
Accelerating voltage: 80~200 kV
Resolution: point of resolution (240 pm)
Energy spread: 0.8 Ev Observation results and EDS analysis results of the cross sections are shown in FIGS. 2 to 7.

FIGS. 2(a)-2(d) are TEM images of cross-section of the polyimide film according to Example 2.

FIGS. 3(a) and 3(b) show a distribution of Si by component analysis with STEM HAADF and EDS mapping for the bright region and the dark region of the polyimide film according to Example 2.

FIGS. 4(a)-4(d) are TEM images of cross-section of the polyimide film according to Comparative Example 1.

FIGS. 5(a) and 5(b) show a distribution of Si by component analysis with STEM HAADF and EDS mapping for the bright region and the dark region of the polyimide film according to Comparative Example 1.

FIGS. 6 and 7 show the results of EDS component analysis of a film produced from the copolymer of Example 2 and Comparative Example 1, respectively.

In FIGS. 2(a)-2(d), it can be seen that the relatively bright region (white) and the relatively dark region (black) are uniformly distributed. From the Si analysis via HAADF technique and the point analysis via EDS mapping, it can be confirmed that the relatively bright region is a region containing Si (FIG. 3). Referring to FIGS. 2(a)-2(d) and FIGS. 3(a) and 3(b), the DMS-DPS domains including Si are co-continuously connected with a size of about 10-30 nm.

The fact that the bright region on the TEM image is uniformly distributed on the polyimide film means that the polyimide containing Si is distributed in a fine phase on the polyimide sample. It means that the portions comprising the DMS-DPS structure are co-continuously connected within the polyimide matrix.

On the other hand, in FIGS. 4(a)-4(d) and FIGS. 5(a) and 5(b), it can be seen that the DMS-DPS domains are aggregated and unevenly distributed with a size of 1 to 5 microns.

FIG. 6 and FIG. 7 show the state of the film coated with the composition of Example 1 and Comparative Example 1 on a glass substrate, and a result of EDS component analysis. In FIG. 6, it can be seen that the DMS-DPS portions in a nano-size have a continuous phase in the polymer. On the other hand, in FIG. 7, it can be seen that the DMS-DPS portions are aggregated and a large amount of Si components were detected in the aggregated portion. In addition, it was confirmed that whitening was occurred on the coated film on the substrate.

Accordingly, even though DMS-DPS oligomers having a high molecular weight are used in the present invention, the DMS-DPS oligomers can be uniformly distributed in the polyimide matrix without phase separation, and the haze is lowered to obtain a polyimide having more transparent characteristics. In addition, since the DMS-DPS structures are present in a continuous phase, mechanical strength and stress relaxation effect of the polyimide can be improved more efficiently. From these characteristics of the composition according to the present invention, thermal properties and optical properties as well as the reduced bending phenomenon of the substrate after coating-curing can be achieved. Therefore, a substrate on which a polyimide film is coated flatly can be obtained. In addition, after peeling off the coated polyimide film from the substrate physically or chemically, bending of the resulting film is reduced and thus the processability can be improved.

In the present invention, a polyimide film is produced by polymerizing a polyimide in an amide-based organic solvent having a positive distribution coefficient (Log P) using a diamine containing Si structure having a high molecular weight. As a result, it is possible to provide a substrate coated with a more colorless and transparent polyimide film having excellent heat resistance and the minimized thermal residual stress without bending of the substrate in the process, and a polyimide film obtained by peeling the substrate.

Yellow index (YI), haze, retardation in the thickness direction, CTE, glass transition temperature (Tg) and glass stress were measured and the results are shown in Table 1.

<Yellowness Index (YI)>

Yellowness index (YI) was measured with Color Eye 7000A.

<Haze>

Haze was measured by the method according to ASTM D1003 using Haze Meter HM-150.

<Retardation in the Thickness Direction>

Retardation in the thickness direction (Rth) was measured with Axoscan. The film was cut into a certain size and the thickness was measured. Then, a retardation value was measured with Axoscan. To compensate the retardation value, the thickness measured while being corrected in the C-plate direction was input to Axoscan.

<Coefficient of Thermal Expansion (CTE) and Glass Transition Temperature (Tg)>

The film was cut into 5×20 mm to prepare a sample, and then the sample was loaded using an accessory. A length of the film to be actually measured was equal to 16 mm. A force pulling the film was set at 0.02 N. The first temperature-rising step was carried out at a heating rate of 5° C./min from 100 to 400° C., then cooling was carried out at a cooling rate of 4° C./min from 400 to 100° C., and the second temperature-rising step was carried out at a heating rate of 5° C./min from 100 to 450° C. The change in the thermal expansion was measured with TMA (Q400, TA Company).

At this time, the inflection point shown in the temperature-rising section during the second temperature-rising step was defined as Tg.

<Glass Stress>

Glass stress is indicated by a Bow value and the measurement method is as follows.

A 10 cm×10 cm glass was placed in a stress meter (FLX2320, TENCOR). After scanning the center with a laser, the degree of bending (height) of the glass was measured at a distance of 4 cm between the left and right sides in a center portion of a total of 8 cm except for 1 cm on both sides.

TABLE 1

|  | Example 1 | Example 2 | Comparative Example 1 |
| --- | --- | --- | --- |
| DMS-DPS Mw | 4400 | 5000 | 5000 |
| Organic solvent | DMPA | DEPA | NMP |
| DMS-DPS content (wt %) | 25 | 25 | 25 |
| PI molecular weight | 78000 | 85000 | 53000 |
| Solid content (wt %) | 15.7 | 14.3 | 16.9 |
| Viscosity (cps) | 3900 | 3800 | 4100 |
| Thickness (μm) | 10 | 10 | 10 |
| YI | 5.8 | 5.9 | 9.6 |
| Haze | 0.2 | 0.3 | 46.8 |
| Rth | 185 | 185 | 190 |
| CTE (100~350° C., $1^{st}$ cooling) | 60 | 60 | 120 |
| Tg (° C.) | 400 | 400 | 350 |
| Real Bow (μm) | 24 | 25 | 24 |
| Stress MPa | 25 | 24 | 23 |

As can be seen from Table 1, the polyimide copolymers of Examples 1 and 2 exhibit improved thermal properties such as glass transition temperature and CTE characteristics as well as haze characteristics by using DMS-DPS having a molecular weight of 4400 g/mol or more. On the other hand, in Comparative Example 1, since a solvent having a negative distribution coefficient is used in spite of using DMS-DPS having a similar molecular weight, DMS-DPS does not have a uniform continuous phase in the polyimide polymer and exhibits aggregation phenomenon partially. As a result, optical characteristics and heat resistance are lowered as compared with Example 2.

While the present invention has been particularly shown and described with reference to specific embodiments thereof, it will be apparent to those skilled in the art that this specific description is merely a preferred embodiment and that the scope of the invention is not limited thereby. It is therefore intended that the scope of the invention be defined by the claims appended hereto and their equivalents.

The invention claimed is:

1. A polyimide copolymer comprising a polymerized product of a composition comprising:
   an acid dianhydride, a diamine and a dimethylsiloxane (DMS)-diphenylsiloxane(DPS) oligomer, as polymerization components; and
   a solvent having a positive distribution coefficient (Log P) at 25° C.,
   wherein a domain of the DMS-DPS with a size of 50 nm or less is uniformly distributed in a matrix of polyimide, and a volume occupied by the DMS-DPS domain is 15 to 30% of the total volume of the copolymer,
   wherein the DMS-DPS oligomer has the following structure:

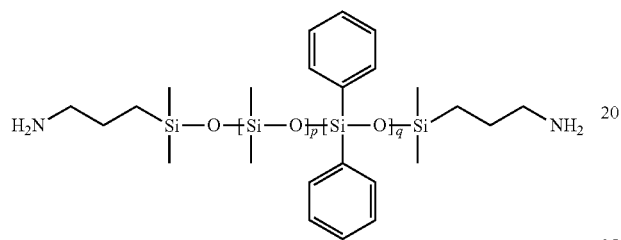

wherein, p and q are molar fractions, and wherein p+q=100, and p is 70 to 90 and q is 10 to 30
wherein the solvent is at least one selected from dimethylpropionamide (DMPA) and diethylpropionamide (DEPA), and
wherein the diamine does not comprise a dimethylsiloxane(DMS)-diphenylsiloxane(DPS) structure.

2. The polyimide copolymer according to claim 1, wherein the size of the DMS-DPS domain is from 1 nm to 50 nm.

3. The polyimide copolymer according to claim 1, wherein the acid dianhydride is at least one selected from tetracarboxylic dianhydrides containing a tetravalent organic group of the following formulas 2a to 2h:

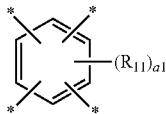
[Formula 2a]

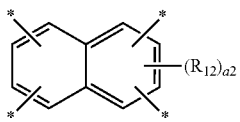
[Formula 2b]

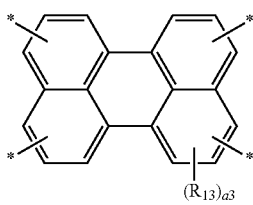
[Formula 2c]

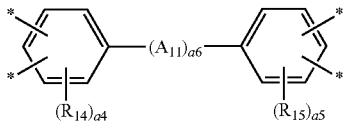
[Formula 2d]

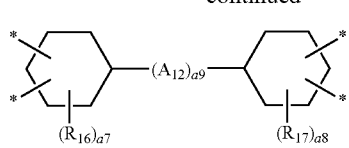
[Formula 2e]

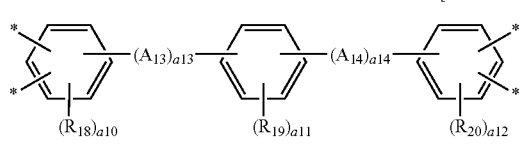
[Formula 2f]

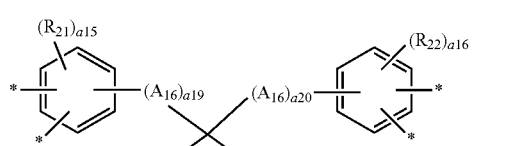
[Formula 2g]

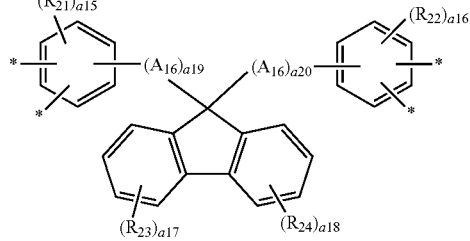

[Formula 2h]

wherein, $R_{11}$ to $R_{24}$ are each independently a substituent selected from the group of —F, —Cl, —Br, —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms, a1 is an integer of 0 to 2, a2 is an integer of 0 to 4, a3 is an integer of 0 to 8, a4 and a5 are each independently an integer of 0 to 3, a7 and a8 are each independently an integer of 0 to 3, a11) and a12 are each independently an integer of 0 to 3, a11 is an integer of 0 to 4, a15 and a16 are each independently an integer of 0 to 4, a17 and a18 are each independently an integer of 0 to 4, and a6, a9, a13, a14, a19 and a20 are each independently an integer of 0 to 3, n is an integer of 1 to 3, and $A_{11}$ to A16 are each independently selected from the group consisting of —O—, —CR'R"—, —C(=O)—, —C(=O)O—, —C(=O)NH—, —S—, —SO$_2$—, a phenylene group and a combination thereof, wherein R' and R" are each independently selected from the group consisting of a hydrogen atom, an alkyl group having 1 to 10 carbon atoms and a fluoroalkyl group having 1 to 10 carbon atoms.

4. The polyimide copolymer according to claim 1, wherein the diamine comprises a diamine containing a divalent organic group of the following formula 3:

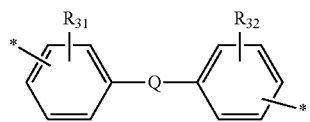
[Formula 3]

In the formula 3,
R$_{31}$ and R$_{32}$ are each independently a substituent selected from the group of —F, —Cl, —Br, —I, a hydroxyl group (—OH), a thiol group (—SH), a nitro group (—NO$_2$), a cyano group, an alkyl group having 1 to 10 carbon atoms, a halogenoalkoxy group having 1 to 4 carbon atoms, a halogenoalkyl group having 1 to 10 carbon atoms and an aryl group having 6 to 20 carbon atoms, and Q is selected from a single bond, —O—, —CR'R"—, —C(=O)—, —C(=O)O—, —C(=O)NH—, —S—, —SO$_2$—, a phenylene group and a combination thereof, wherein R' and R" are each independently selected from the group consisting of a hydrogen atom, an alkyl group having 1 to 10 carbon atoms and a fluoroalkyl group having 1 to 10 carbon atoms.

5. The polyimide copolymer according to claim 1, wherein the acid dianhydride comprises a tetracarboxylic dianhydride containing a structure of the following formula 4 in an amount of 20 to 80 mol % based on the total amount of the tetracarboxylic dianhydride.

[Formula 4]

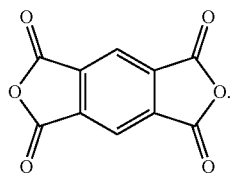

6. The polyimide copolymer according to claim 1, wherein the acid dianhydride comprises a tetracarboxylic dianhydride of the following formula 5 in an amount of 20 to 80 mol % based on the total amount of the tetracarboxylic dianhydride:

[Formula 5]

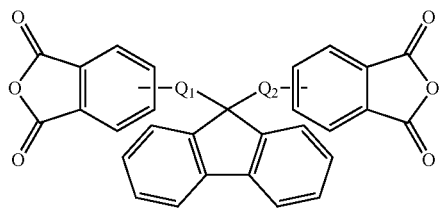

In the formula 5,
Q$_1$ and Q$_2$ are each independently selected from the group consisting of a single bond, —O—, —C(=O)—, —C(=O)O—, —C(=O)NH—, —S—, —SO$_2$—, a phenylene group and a combination thereof.

7. The polyimide copolymer according to claim 1, wherein the acid dianhydride comprises tetracarboxylic dianhydrides of the following formulas 4 and 5 together:

[Formula 4]

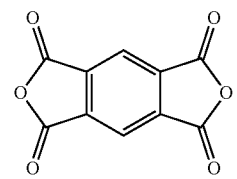

[Formula 5]

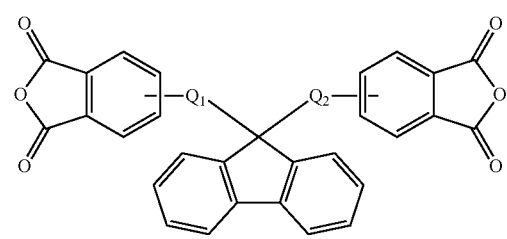

In the formula 5,
Q$_1$ and Q$_2$ are each independently selected from the group consisting of a single bond, —O—, —C(=O)—, —C(=O)O—, —C(=O)NH—, —S—, —SO$_2$—, a phenylene group and a combination thereof.

8. A polyimide film produced from the polyimide copolymer according to claim 1.

9. The polyimide film according to claim 8, wherein the polyimide film has a haze of 2 or less.

10. The polyimide film according to claim 8, wherein the polyimide film has a glass transition temperature (Tg) of 350° C. or higher.

11. The polyimide film according to claim 8, wherein the polyimide film has coefficient of thermal expansion (CTE) of 100 ppm/° C. or less.

12. A transparent polyimide substrate for an oxide TFT or an LTPS produced from the polyimide copolymer according claim 1.

* * * * *